(12) United States Patent
Sasano

(10) Patent No.: US 9,497,827 B2
(45) Date of Patent: Nov. 15, 2016

(54) LIGHT-EMITTING APPARATUS AND METHOD OF MANUFACTURING LIGHT-EMITTING APPARATUS

(75) Inventor: Haruaki Sasano, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 332 days.

(21) Appl. No.: 13/877,013

(22) PCT Filed: May 11, 2011

(86) PCT No.: PCT/JP2011/060823
§ 371 (c)(1),
(2), (4) Date: Mar. 29, 2013

(87) PCT Pub. No.: WO2012/042962
PCT Pub. Date: Apr. 5, 2012

(65) Prior Publication Data
US 2013/0193862 A1      Aug. 1, 2013

(30) Foreign Application Priority Data

Sep. 30, 2010  (JP) .................. 2010-221750

(51) Int. Cl.
*H05B 37/02* (2006.01)
*H05B 39/04* (2006.01)
(Continued)

(52) U.S. Cl.
CPC ........... *H05B 37/00* (2013.01); *H01L 25/0753* (2013.01); *H01L 33/62* (2013.01); *H01L 2224/48137* (2013.01)

(58) Field of Classification Search
CPC ...................................................... H05B 37/00

USPC ......................................................... 315/192
See application file for complete search history.

(56) References Cited

U.S. PATENT DOCUMENTS 4,935,665 A      6/1990 Murata
2008/0224608 A1  9/2008 Konishi et al.
(Continued)

FOREIGN PATENT DOCUMENTS

CN        101433129 A    5/2009
JP           2-78102 A    3/1990
(Continued)

OTHER PUBLICATIONS

International Search Report and Written Opinion dated Aug. 2, 2011 corresponding to International Patent Application No. PCT/JP2011/060823.

(Continued)

*Primary Examiner* — Lincoln Donovan
*Assistant Examiner* — Metasebia Retebo
(74) *Attorney, Agent, or Firm* — Squire Patton Boggs (US) LLP

(57) ABSTRACT

Provided is a light-emitting apparatus, wherein a plurality of light-emitting elements that emit the same type of color are arranged in a plurality of row directions and column directions, the plurality of light-emitting elements arranged in the row direction are connected in series in the row direction, and the rows having the plurality of light-emitting elements connected in series are connected in parallel. The plurality of light-emitting elements comprise first light-emitting elements, and second light-emitting elements having smaller outputs than the first light-emitting elements, and the first light-emitting elements and the second light-emitting elements are arranged alternately in each of the row directions.

20 Claims, 12 Drawing Sheets

(51) Int. Cl.
*H05B 41/36* (2006.01)
*H05B 37/00* (2006.01)
*H01L 25/075* (2006.01)
*H01L 33/62* (2010.01)

(56) References Cited

U.S. PATENT DOCUMENTS

2009/0091947 A1* 4/2009 Chou ............... G02F 1/133603
 362/612
2009/0166657 A1* 7/2009 Yamada ............ H01L 33/60
 257/98
2009/0236620 A1* 9/2009 Park ................ G02F 1/133603
 257/89
2010/0231613 A1 9/2010 Hamada

FOREIGN PATENT DOCUMENTS

| JP | 2000-047606 A | 2/2000 |
| JP | 2001-222242 A | 8/2001 |
| JP | 2002-170999 A | 6/2002 |
| JP | 2003-124528 A | 4/2003 |
| JP | 2008-078365 A | 4/2008 |
| JP | 2008-180842 A | 8/2008 |
| JP | 2008-227412 A | 9/2008 |
| JP | 2010-087064 A | 4/2010 |
| JP | 2011-113941 A | 6/2011 |

OTHER PUBLICATIONS

Japanese Notification of Reason for Rejection from the Japanese Patent Office application No. 2012-536244 dated Jan. 6, 2015.

* cited by examiner

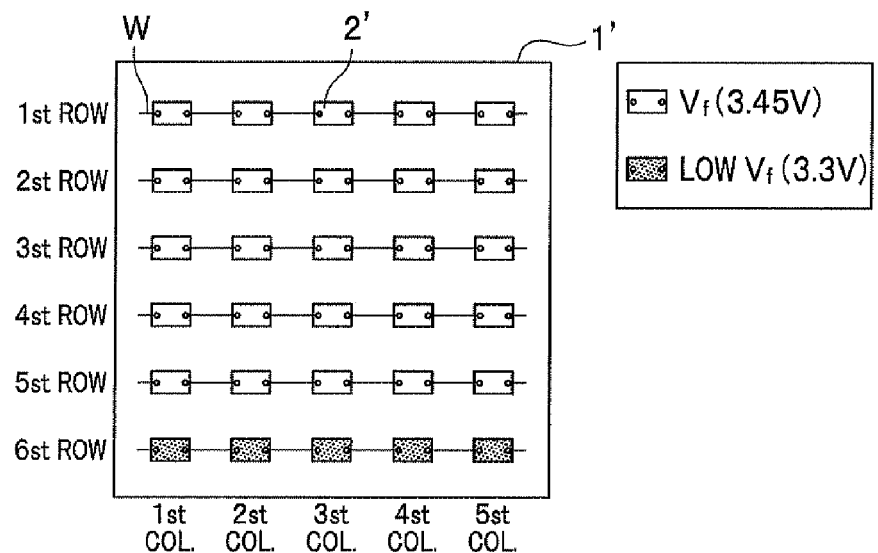

FIG.6A

| | | | | | (AVERAGE) | | HIGH OUTPUT |
|---|---|---|---|---|---|---|---|
| LOW OUTPUT 22 | 2 | 2 | 2 | 2 | 2 | | 5 |
| HIGH OUTPUT 21 | 4 | 4 | 4 | 4 | 4 | | 4 |
| LOW OUTPUT | 2 | 2 | 2 | 2 | 2 | | 3 |
| HIGH OUTPUT | 4 | 4 | 4 | 4 | 4 | | 2 |
| (AVERAGE) | 3 | 3 | 3 | 3 | | | 1 |

LOW OUTPUT

FIG.6B

| | | | | | (AVERAGE) | |
|---|---|---|---|---|---|---|
| LOW OUTPUT 22 | 2 | 2 | 2 | 2 | 2 | |
| HIGH OUTPUT 21 | 5 | 5 | 5 | 5 | 5 | INCREASED CURRENT (CONTAINING LOW V_f DEVICE) |
| LOW OUTPUT | 1 | 1 | 1 | 1 | 1 | DECREASED CURRENT (CONTAINING HIGH V_f DEVICE) |
| HIGH OUTPUT | 4 | 4 | 4 | 4 | 4 | |
| (AVERAGE) | 3 | 3 | 3 | 3 | | |

FIG.6C

| | | | | | (AVERAGE) | |
|---|---|---|---|---|---|---|
| LOW OUTPUT 22 | 3 | 3 | 3 | 3 | 3 | INCREASED CURRENT (CONTAINING LOW V_f DEVICE) |
| HIGH OUTPUT 21 | 3 | 3 | 3 | 3 | 3 | DECREASED CURRENT (CONTAINING HIGH V_f DEVICE) |
| LOW OUTPUT | 3 | 3 | 3 | 3 | 3 | INCREASED CURRENT (CONTAINING LOW V_f DEVICE) |
| HIGH OUTPUT | 3 | 3 | 3 | 3 | 3 | DECREASED CURRENT (CONTAINING HIGH V_f DEVICE) |
| (AVERAGE) | 3 | 3 | 3 | 3 | | |

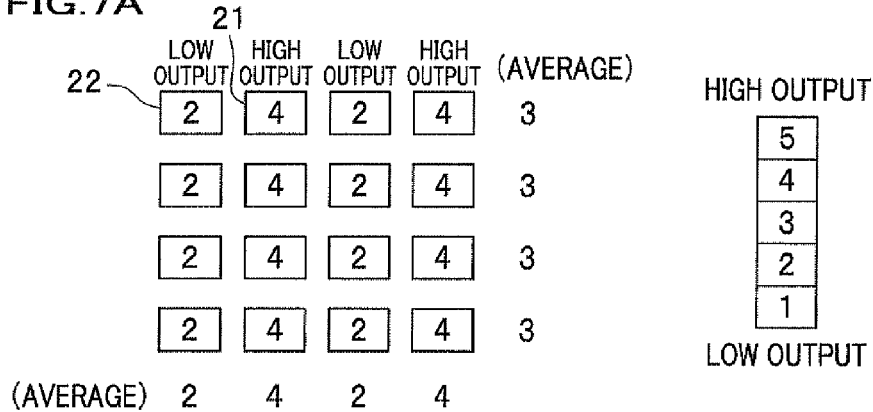
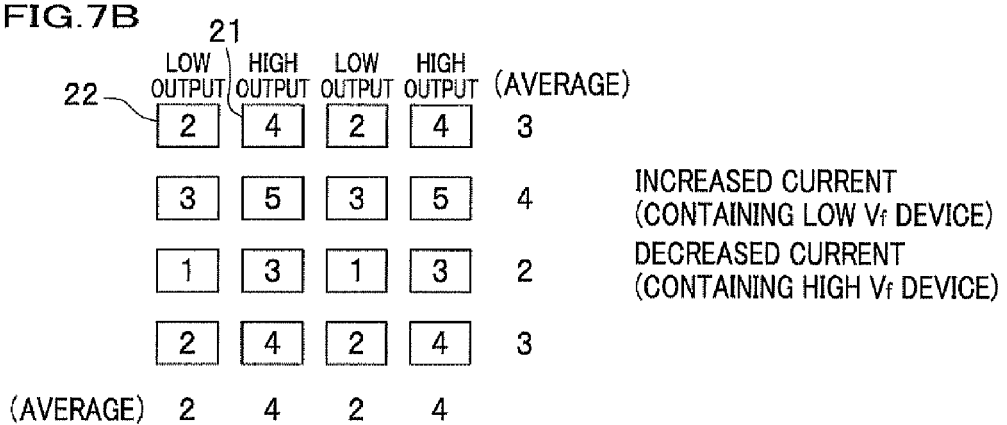
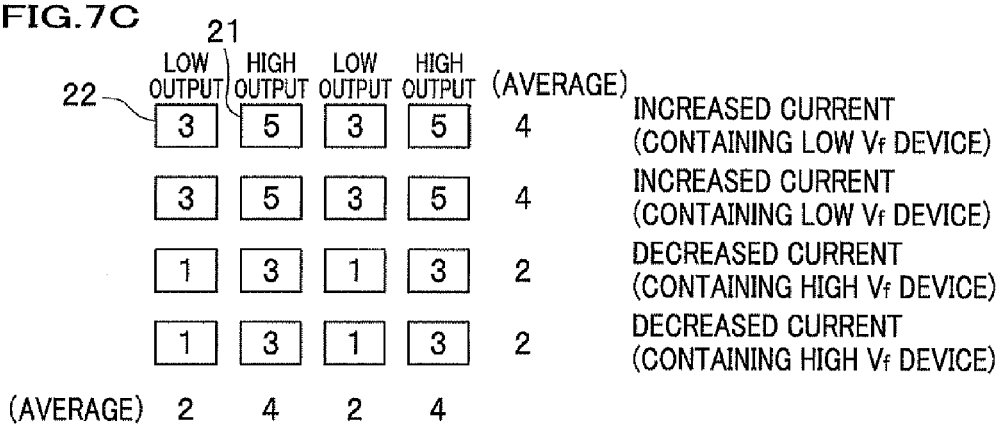

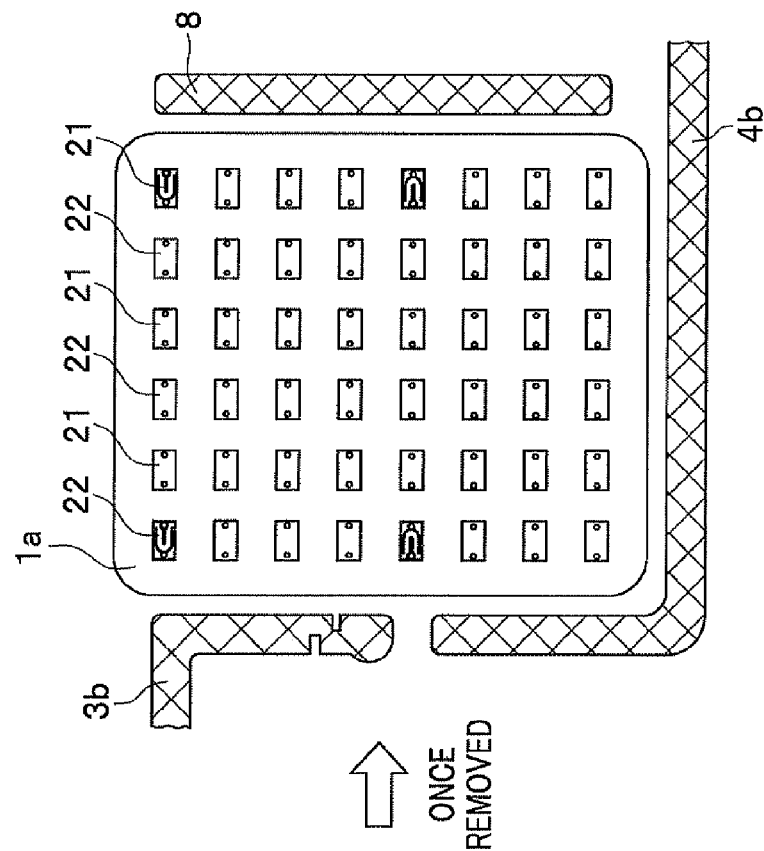
FIG.8A  FIRST STEP
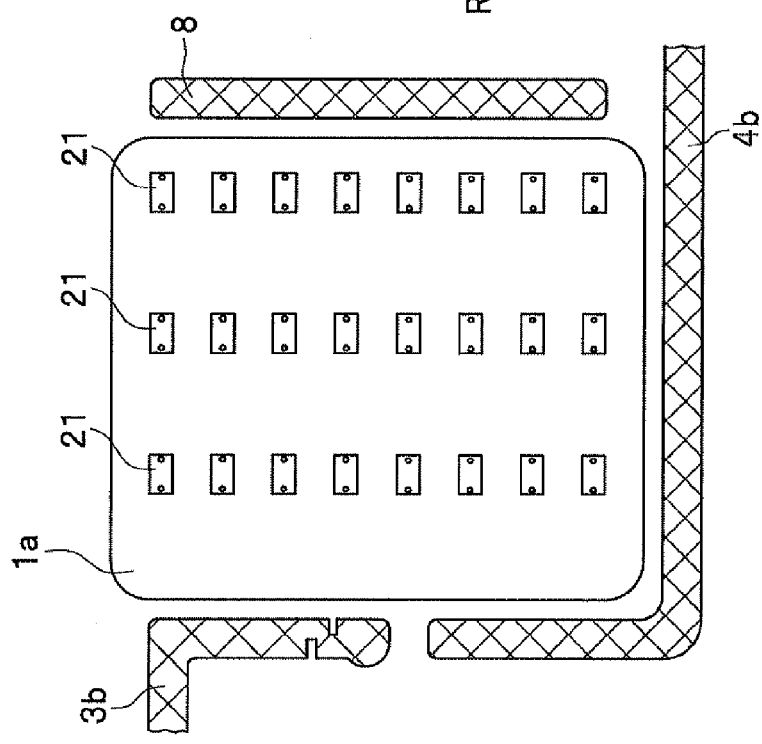
FIG.8B  SECOND STEP

LIGHT-EMITTING APPARATUS AND METHOD OF MANUFACTURING LIGHT-EMITTING APPARATUS

TECHNICAL FIELD

The present invention relates to light-emitting apparatuses which can be used for illuminators, etc., such as an LED light bulb and a spotlight. Also, the present invention relates to a method for manufacturing the light-emitting apparatus.

BACKGROUND ART

Recently, various light-emitting apparatuses having a plurality of light-emitting devices on a substrate have been developed. The light-emitting devices used in such light emitting apparatuses tend to exhibit variations in characteristics such as a color (wavelength) and a light output (power) regarding each wafer (i.e., each manufacturing lot) and/or manufacturing equipment used. Because of this, the light-emitting devices are first classified into various ranks according to their color and output, etc. Then, the light-emitting devices at the same rank are used for the same light-emitting apparatus. This promotes the characteristics of the light-emitting device to be made uniform.

However, exclusive use of light-emitting devices at a specific rank means that only some of the light-emitting devices manufactured are going to be used, which leads to a decrease in yield of the light-emitting devices. In a light-emitting apparatus using a plurality of light-emitting devices, in particular, the light-emitting devices account for a large percentage of the total cost. If the light-emitting devices at a specific rank are exclusively used, their yield decreases and their cost increases. Accordingly, the following technology has been previously disclosed.

Patent Literature 1, for example, discloses a display having a plurality of LED pairs modulated simultaneously, wherein the LED pairs include a combination of LEDs having an approximately symmetrical luminous intensity with regard to the center of a luminous intensity distribution formed between a region having the maximum luminosity and a region having the minimum luminosity of the LEDs.

In addition, Patent Literature 2 discloses a method for mounting LED chips which are mounted like a grid on a substrate, including the step of arranging LED chips of the same manufacturing lot in a way the LED chips are not adjacent to each other.

Furthermore, Patent Literature 3 discloses a method for manufacturing a display, including the steps of dividing a wafer having arranged light-emitting devices into blocks; determining averages of characteristics such as a wavelength and brightness of the light-emitting devices in each block; and rearranging and disposing each block on a relay substrate so as to make the averages of characteristics distributed uniformly over the surface of the relay substrate.

CITATION LIST

Patent Literature

[Paten Literature 1] JP-2000-047606A (see FIGS. 1 and 2)
[Paten Literature 2] JP-2008-078365A (see FIGS. 9 and 10)
[Patent Literature 3] JP-2010-087064A (see FIG. 5)

DISCLOSURE OF THE INVENTION

Problems to be Solved by the Invention

Unfortunately, light-emitting devices used for a light-emitting apparatus sometimes have variations in a forward voltage (hereinafter, referred to as $V_f$) in each wafer, in addition to those in characteristics such as a color and output. As used herein, the term "$V_f$" refers to a voltage necessary to make current flow in a forward direction with respect to a light-emitting device (light-emitting diode), namely a voltage necessary for the light emitting device to emit light. Usually, a lower $V_f$ in a light-emitting device facilitates current flow and a higher $V_f$ in a light-emitting device reduces current flow. In a light-emitting apparatus having a plurality of light-emitting devices, a current flows through the plurality of light-emitting devices between a pair of electrodes of the light-emitting apparatus. Accordingly, when it is tried to make an equal current pass through all of the light-emitting devices, the current may be deviated due to a variation in $V_f$ of the light-emitting device. In the techniques disclosed in Patent Literatures 1 to 3, a variation in $V_f$ and/or a way to connect light-emitting devices may cause their light output to change and may generate unevenness in brightness (unevenness in lighting) of the light-emitting apparatus. In addition, a difference in a brightness distribution (output distribution) among the light-emitting apparatuses may occur.

The present invention has been conceived in view of the above problems. The present inventors have focused on a point that when a plurality of light-emitting devices are serially connected, a current flow in the light-emitting devices is averaged. It is an object of the present invention to provide a light-emitting apparatus and a method for manufacturing the light-emitting apparatus in which unevenness in brightness of the light-emitting apparatus and a difference in a brightness distribution among the light-emitting apparatuses can be reduced.

Means for Solving the Problems

In order to solve the above problems, an aspect of the present invention provides a light-emitting apparatus, including a plurality of light-emitting devices emitting the same hue, wherein the light-emitting devices are arranged in a plurality of row and column directions; the light-emitting devices arranged in the row direction are serially connected in the row direction; and each row having the serially connected light-emitting devices is connected in parallel, the light-emitting devices including a first and a second light-emitting devices, wherein the second light-emitting device has a lower output than that of the first light-emitting device; and the first and the second light-emitting devices are alternately disposed in each row direction.

In such a configuration, two types of light-emitting device having different outputs are connected in series and in parallel. The light-emitting apparatus using this configuration can have reduced unevenness in brightness. In addition, even if the $V_f$ values of the light-emitting devices vary as described below, a difference in a brightness distribution among the light-emitting apparatuses can be reduced. Consequently, the difference can be reduced without exclusively using light-emitting devices with a specific $V_f$ as the light-emitting devices of the light-emitting apparatus.

In addition, it is preferable that a light-emitting apparatus according to an embodiment of the present invention includes at least one row in which an average of forward voltages of the light-emitting devices differs from that of another row.

According to such a configuration, for example, when the light-emitting apparatus includes a light-emitting device with a different $V_f$ among the light-emitting devices, a current flow in a row may increase or decrease because the $V_f$ average of the light-emitting devices in the row differs from that of another row. Even in that case, the light outputs in the row direction do not become uniformly high or low because two types of the light emitting device with different outputs are alternately disposed in the row direction in which the light-emitting devices are connected in series. The light outputs can also be dispersed in the row direction. In addition, even if the light-emitting devices include a light-emitting device with a different $V_f$, the light-emitting device with a different output is likely to be dispersed as a whole. As a result, bright and/or dark spots are hardly concentrated in a particular row, which can reduce unevenness in brightness as a whole.

Also, a light-emitting apparatus according to an embodiment of the present invention preferably includes the first and the second light-emitting devices, wherein the light-emitting devices are continuously arranged in the column direction.

Such a configuration makes it easier to accurately arrange a plurality of light-emitting devices on a substrate during a light-emitting device arrangement step in the process of manufacturing a light-emitting apparatus.

Also, a light-emitting apparatus according to an embodiment of the present invention preferably includes the first and the second light-emitting devices, wherein the first and the second light-emitting devices are alternately arranged in the column direction Such a configuration makes it possible to disperse their light outputs into a row and a column directions, which can reduce unevenness in brightness. In addition, there is a case in which the light-emitting devices include a light-emitting device with a different $V_f$ so that a row containing the light-emitting device with a different $V_f$ may have an increased or decreased current flow. Even in that case, the light-emitting devices with different outputs are alternately arranged not only in the row direction in which the light-emitting devices are serially connected but also in the column direction. Accordingly, the light outputs in the row and the column directions can be dispersed. Furthermore, even if the light-emitting devices include a light-emitting device with a different $V_f$, bright and/or dark spots are hardly concentrated in a particular row or column, which can reduce unevenness in brightness as a whole.

Also, in a light-emitting apparatus according to an embodiment of the present invention, the numbers of the first and the second light-emitting devices which are alternately disposed in each row direction are preferably the same.

Such a configuration makes it possible to uniformly disperse light-emitting devices with different outputs in a light-emitting apparatus because the numbers of two types of the light-emitting devices with different outputs are the same at least in a row direction and the devices are evenly arranged. This can reduce unevenness in brightness of the light-emitting apparatus. In addition, there is a case in which the light-emitting devices include a light-emitting device with a different $V_f$ so that a row containing the light-emitting device with a different $V_f$ may have an increased or decreased current flow. Even in that case, it is possible to uniformly disperse the light-emitting device with a different output, which can reduce unevenness in brightness of the light-emitting apparatus.

Meanwhile, in order to solve the above problems, another aspect of the present invention provides a light-emitting apparatus, including a plurality of light-emitting devices emitting the same hue, wherein the light-emitting devices are arranged in a plurality of row and column directions; the light-emitting devices arranged in the row direction are serially connected in the row direction; and each row having the serially connected light-emitting devices is connected in parallel, the light-emitting devices including a first, a second, and a third light-emitting device, wherein the second light-emitting device has a lower output than that of the first light-emitting device; the third light-emitting device has a lower output than that of the second light-emitting device; and the first, the second, and the third light-emitting devices are disposed in each row direction in a predetermined order.

In such a configuration, three types of light-emitting device having different outputs are connected in series and in parallel. The light-emitting apparatus using this configuration can have reduced unevenness in brightness. In addition, even if the $V_f$ values of the light-emitting devices vary as described below, a difference in a brightness distribution among the light-emitting apparatuses can be reduced. Consequently, the difference can be reduced without exclusively using light-emitting devices with a specific $V_f$ as the light-emitting devices of the light-emitting apparatus.

In addition, it is preferable that a light-emitting apparatus according to an embodiment of the present invention includes at least one row in which an average of forward voltages of the light-emitting devices differs from that of another row.

According to such a configuration, when the light-emitting apparatus includes a light-emitting device with a different $V_f$ among the light emitting devices, a row containing the light-emitting device with a different $V_f$ may have an increased or decreased current flow. Even in that case, the light outputs in the row direction do not become uniformly high or low because three types of light-emitting device having different outputs are disposed in a predetermined order in the row direction in which the light-emitting devices are connected in series. The light outputs in the row direction can also be dispersed. In addition, even if the light-emitting devices include a light-emitting device with a different $V_f$, the light-emitting device with a different output is likely to be dispersed as a whole. As a result, bright and/or dark spots are hardly concentrated in a particular row, which can reduce unevenness in brightness as a whole.

Also, a light-emitting apparatus according to an embodiment of the present invention preferably includes the first, the second, and the third light-emitting device, wherein the light-emitting devices are continuously arranged in the column direction Such a configuration makes it easier to accurately arrange light-emitting devices on a substrate during a light-emitting device arrangement step in the process of manufacturing a light-emitting apparatus.

Also, a light-emitting apparatus according to an embodiment of the present invention preferably includes the first, the second, and the third light-emitting device, wherein the first, the second, and the third light-emitting devices are arranged in a predetermined order in the column direction In such a configuration, the light-emitting devices with different outputs are arranged in a predetermined order not only in the row direction in which the light-emitting devices are serially connected but also in the column direction in the light-emitting apparatus. Accordingly, in the light-emitting apparatus, light outputs in the row and column directions do not become uniformly high or low and the light outputs can be dispersed in the row and column directions. This can reduce unevenness in brightness of the light-emitting apparatus. In addition, there is a case in which the light-emitting devices include a light-emitting device with a different $V_f$ so that a row containing the light-emitting device with a different $V_f$ may have an increased or decreased current flow. Even in that case, the light outputs in the row and column directions do not become uniformly high or low and the light outputs can be dispersed in the row and column directions. Furthermore, even if the light-emitting devices include a light-emitting device with a different $V_f$, bright and/or dark spots are hardly concentrated in a particular row or column, which can reduce unevenness in brightness as a whole.

Also, in a light-emitting apparatus according to an embodiment of the present invention, the numbers of the first, the second, and the third light-emitting devices which are disposed in a predetermined order in each row direction are preferably equal to one another.

Such a configuration makes it possible to uniformly disperse light-emitting devices with different outputs in the light-emitting apparatus because the numbers of three types of the light-emitting device with different outputs are the same and the device are evenly arranged. This can reduce unevenness in brightness of the light-emitting apparatus as a whole. In addition, there is a case in which the light-emitting devices include a light-emitting device with a different $V_f$ so that a row containing the light-emitting device with a different $V_f$ may have an increased or decreased current flow. Even in that case, it is possible to uniformly disperse the light-emitting device with a different output, which can reduce unevenness in brightness of the light-emitting apparatus as a whole.

Further, a light-emitting apparatus according to an embodiment of the present invention preferably includes: a substrate on which a plurality of light-emitting devices are arranged; an anode and a cathode to apply a voltage to the plurality of light-emitting devices, the anode and the cathode being formed on the substrate; and a light-reflecting resin formed on the substrate, the resin surrounding the plurality of light-emitting devices.

In such a configuration, light emitted by the plurality of light-emitting devices is reflected by the light-reflecting resin, which can improve a light extraction efficiency of the light-emitting apparatus.

Also, in order to solve the above problems, another aspect of the present invention provides a light-emitting apparatus including: a plurality of light-emitting devices emitting the same hue, the light-emitting devices being arranged in a plurality of row and column directions; a substrate on which the light-emitting devices are arranged; an anode wiring section and a cathode wiring section electrically connected to the light-emitting devices, the sections being formed on the substrate; and an anode and a cathode between which a voltage is applied via the anode wiring section and the cathode wiring section, wherein the same number of the light-emitting devices is serially connected; and each end of the serially connected light-emitting devices is arranged in a column direction and is electrically connected to either the anode wiring section or the cathode wiring section to be connected in parallel, the light-emitting devices including a first and a second light-emitting devices, wherein the second light-emitting device has a lower output than that of the first light-emitting device; and the first and the second light-emitting devices are alternatively disposed in each row direction.

In such a configuration, two types of light-emitting device having different outputs are connected in series and in parallel. The light-emitting apparatus using this configuration can have reduced unevenness in brightness. In addition, even if the $V_f$ values of the light-emitting devices vary as described below, a difference in a brightness distribution among the light-emitting apparatuses can be reduced. Consequently, the difference can be reduced without exclusively using light-emitting devices with a specific $V_f$ as the light-emitting devices of the light-emitting apparatus.

Also, a light-emitting apparatus according to an embodiment of the present invention preferably includes the first and the second light-emitting devices, wherein the light-emitting devices are continuously arranged in the column direction.

Such a configuration makes it easier to accurately arrange a plurality of light-emitting devices on a substrate during a light-emitting device arrangement step in the process of manufacturing a light-emitting apparatus.

Also, a light-emitting apparatus according to an embodiment of the present invention preferably includes the first and the second light-emitting devices, wherein the first and the second light-emitting devices are alternately arranged in the column direction Such a configuration makes it possible to disperse their light outputs into a row and a column direction, which can reduce unevenness in brightness. In addition, there is a case in which the light-emitting devices include a light-emitting device with a different $V_f$ so that a row containing the light-emitting device with a different $V_f$ may have an increased or decreased current flow. Even in that case, the light-emitting devices with different outputs are alternately arranged not only in the row direction in which the light-emitting devices are serially connected but also in the column direction. Accordingly, the light outputs in the row and the column direction can be dispersed. Furthermore, even if the light-emitting devices include a light-emitting device with a different $V_f$, bright and/or dark spots are hardly concentrated in a particular row or column, which can reduce unevenness in brightness as a whole.

Also, in a light-emitting apparatus according to an embodiment of the present invention, the numbers of the first and the second light-emitting devices which are alternately disposed in each row direction are preferably equal.

Such a configuration makes it possible to uniformly disperse light-emitting devices with different outputs in the light-emitting apparatus because the numbers of two types of the light-emitting devices with different outputs are the same at least in a row direction and the devices are evenly arranged. This can reduce unevenness in brightness of the light-emitting apparatus. In addition, there is a case in which the light-emitting devices include a light-emitting device with a different $V_f$ so that a row containing the light-emitting device with a different $V_f$ may have an increased or decreased current flow. Even in that case, it is possible to uniformly disperse the light-emitting device with a different output, which can reduce unevenness in brightness of the light-emitting apparatus.

Additionally, in order to solve the above problems, another aspect of the present invention provide a method for manufacturing a light-emitting apparatus, including: a plurality of light-emitting devices emitting the same hue, wherein the light-emitting devices are arranged in a plurality of row and column directions; the light-emitting devices arranged in the row direction are serially connected in the row direction; and each row having the serially connected light-emitting devices is connected in parallel, wherein the method includes: a light-emitting device classification step of classifying the plurality of light-emitting devices emitting the same hue into a first and a second groups, the second group having a lower output than that of the first group; and a light-emitting device arrangement step including: arranging first light-emitting devices selected from the first group and second light-emitting devices selected from the second group in the row and column directions on a substrate having an anode and a cathode so that the first and the second light-emitting devices are alternately disposed in the row and column directions; serially connecting the light-emitting devices disposed in each row direction; connecting each row in parallel; and electrically connecting the light-emitting devices between the anode and the cathode.

According to the method for manufacturing a light-emitting apparatus having such a configuration, a light-emitting apparatus with reduced unevenness in brightness can be manufactured by connecting two types of light-emitting device with different outputs in series and in parallel. In addition, when the light-emitting devices include a light-emitting device with a different $V_f$, a row containing the light-emitting device with a different $V_f$ may have an increased or decreased current flow. Even in that case, the light outputs in the row direction do not become uniformly high or low because two types of light-emitting device with different outputs are disposed in a predetermined order in the row direction in which the light-emitting devices are connected in series. Accordingly, it is possible to manufacture a light-emitting apparatus which can disperse the light outputs in the row direction. Furthermore, even if the light-emitting devices include a light-emitting device with a different $V_f$, bright and/or dark spots are hardly concentrated in a particular row. Accordingly, a light-emitting apparatus with reduced unevenness in brightness as a whole can be manufactured.

Also, a method for manufacturing a light-emitting apparatus according to an embodiment of the present invention includes the light-emitting device arrangement step further including: a first step of arranging the first light-emitting devices in a column direction and a second step of arranging the second light emitting devices in a column direction adjacent to the column direction having the first light-emitting devices arranged in the first step.

The method for manufacturing a light-emitting apparatus having such a configuration can make it easier to accurately arrange the first and the second light-emitting devices with different outputs on a substrate.

Advantageous Effects of Invention

A light-emitting apparatus according to an embodiment of the present invention can reduce unevenness in brightness of the light-emitting apparatus by connecting light-emitting devices with different outputs in series and in parallel. In addition, a difference in a brightness distribution among the light-emitting apparatuses can be reduced. Also, a method for manufacturing a light-emitting apparatus according to an embodiment of the present invention makes it possible to easily manufacture the light-emitting apparatus capable of reducing the above-described unevenness in brightness and the difference in the brightness distribution among the light-emitting apparatuses.

BRIEF DESCRIPTION OF DRAWINGS

FIG. 3 includes schematic diagrams illustrating changes in a current and a thermal distribution when light-emitting devices are serially connected in row directions and all of the light-emitting devices in the 6th row are the devices with a lower $V_f$. FIG. 3A schematically illustrates how to arrange the light-emitting devices. FIG. 3B is a schematic diagram illustrating the results regarding a shunt current simulation of the light-emitting devices. FIG. 3C is a schematic diagram illustrating a thermal distribution of the light-emitting devices.

FIG. 4 includes schematic diagrams illustrating changes in a current and a thermal distribution when light-emitting devices are serially connected in row directions and each of the 2nd to 6th rows contains a device with a lower $V_f$.

FIG. 5 schematically illustrates how to arrange light-emitting devices in a light-emitting apparatus according to the first embodiment of the present invention.

FIG. 6 includes schematic diagrams illustrating a relationship between the arrangement and the light output of the first and second light-emitting devices when a light-emitting apparatus contains a device with a lower $V_f$ among the other light-emitting devices, the apparatus having two types of light-emitting device with different light outputs arranged alternately in each column direction. FIG. 6A is a schematic diagram showing the light outputs of the first and second light-emitting devices when all of the devices have an identical $V_f$. FIG. 6B is a schematic diagram showing the light outputs of the first and second light-emitting devices when one row contains a device with a lower $V_f$ and another row contains a device with a higher $V_f$. FIG. 6C is a schematic diagram showing the light outputs of the first and second light-emitting devices when all of the rows contain either a device with a lower $V_f$ or a device with a higher $V_f$.

FIG. 7 includes schematic diagrams illustrating a relationship between the arrangement and the light output of the first and second light-emitting devices when a light-emitting apparatus contains a device with a lower $V_f$ among the other light-emitting devices, the apparatus having two types of light-emitting device with different light outputs arranged alternately in each row direction. FIG. 7A is a schematic diagram showing the light outputs of the first and second light-emitting devices when all of the devices have an identical $V_f$. FIG. 7B is a schematic diagram showing the light outputs of the first and second light-emitting devices when one row contains a device with a lower $V_f$ and another row contains a device with a higher $V_f$. FIG. 7C is a schematic diagram showing the light outputs of the first and second light-emitting devices when all of the rows contain either a device with a lower $V_f$ or a device with a higher $V_f$.

FIG. 8 schematically illustrates a light-emitting device arrangement step in a method for manufacturing a light-emitting apparatus according to an embodiment of the present invention. FIG. 8A illustrates the first step and FIG. 8B illustrates the second step.

FIG. 9 schematically illustrates how to arrange light-emitting devices in a light-emitting apparatus according to the second embodiment of the present invention.

FIG. 10 schematically illustrates how to arrange light-emitting devices in a light-emitting apparatus according to the third embodiment of the present invention.

FIG. 11 schematically illustrates how to arrange light-emitting devices in a light-emitting apparatus according to the fourth embodiment of the present invention.

FIG. 12 is a layout in the case of having 8 rows×6 columns.

EMBODIMENTS FOR CARRYING OUT THE INVENTION

Figure 1:
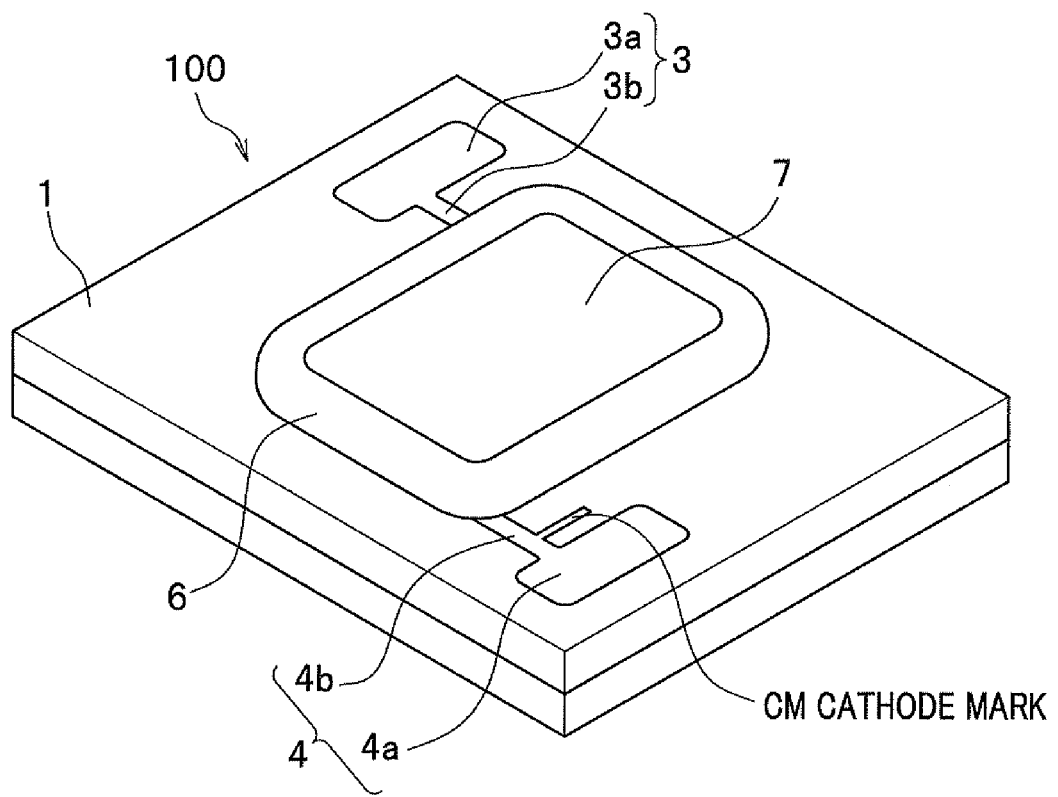
FIG. 1 is a perspective view illustrating a general configuration of a light-emitting apparatus according to the first embodiment of the present invention.

The following describes light-emitting apparatuses according to embodiments of the present invention by referring to the drawings. Note that in some cases, the size and position of a member in each drawing are emphasized for clarity of the description. Further, in the following description, the same name and sign essentially denote the same or similar member so as to appropriately avoid redundancy.

[First Embodiment]

Figure 2:
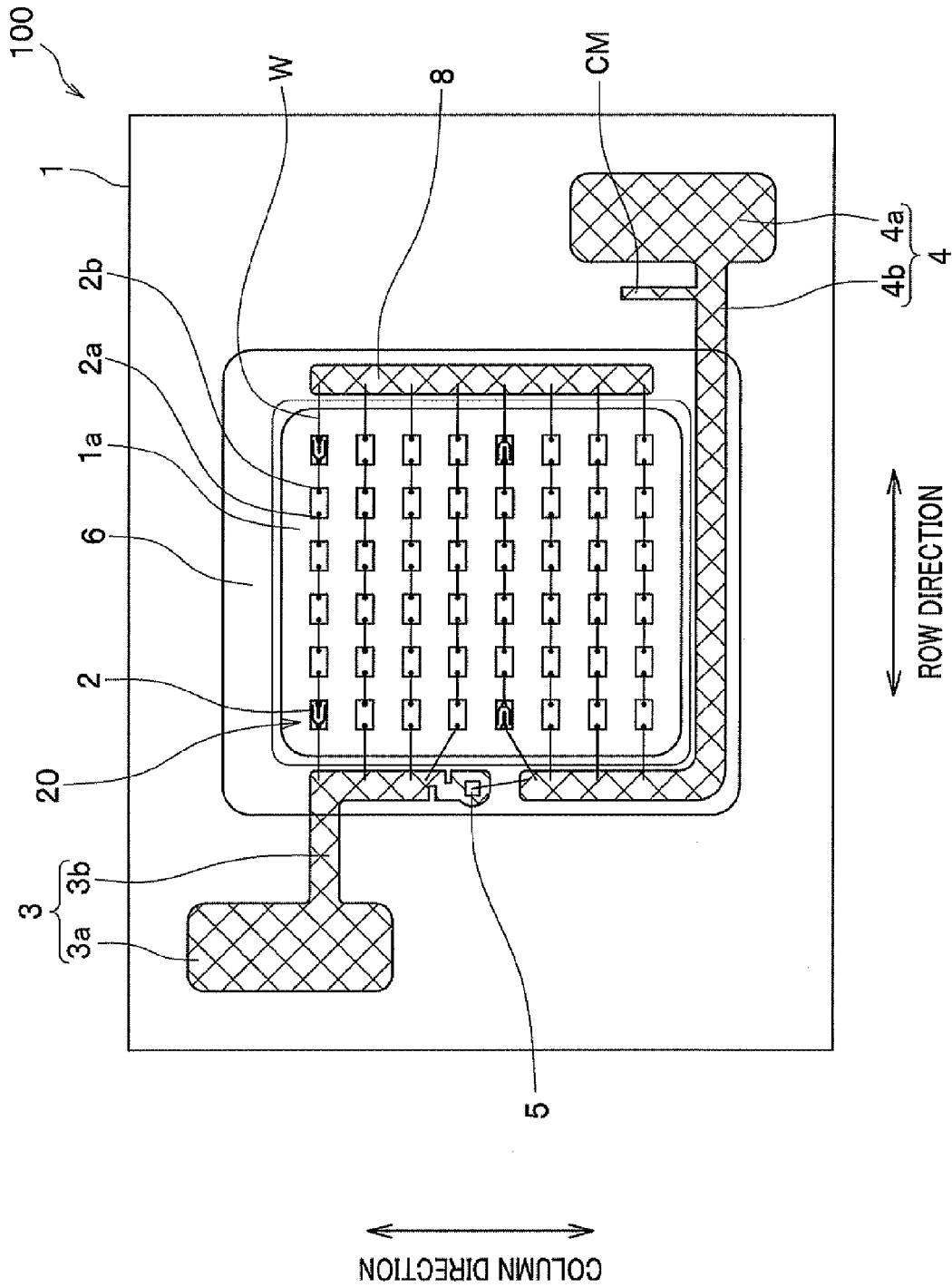
FIG. 2 is a front view illustrating a general configuration of a light-emitting apparatus according to the first embodiment of the present invention.

The following details a light-emitting apparatus 100 according to the first embodiment by referring to FIGS. 1 to 7. First, the following description illustrates a general configuration of the light-emitting apparatus 100, and then illustrates each component. Note that a light-reflecting resin 6 in FIG. 2 is depicted only by a contour for convenience of description. In addition, with regard to a p-electrode 2a and an n-electrode 2b of a light-emitting device 2 in FIG. 2, a current direction has been indicated at only four light-emitting devices 2 on a mounting region 1a for convenience of description. The other light-emitting devices on the mounting region 1a do not have illustration regarding the direction. Furthermore, for convenience of description, a wire W, which serially connects between a first light-emitting device 21 and a second light-emitting device 22 in a row direction, is not depicted in FIGS. 5 to 7.

<General Configuration>

For example, a light-emitting apparatus 100 can be used for illuminators such as a LED light bulb and a spotlight. As shown in FIGS. 1 and 2, the light-emitting apparatus 100 mainly includes: a substrate 1; a plurality of light-emitting devices 2 disposed on a mounting region 1a of the substrate 1; an anode 3 and a cathode 4 formed on the substrate 1; a protection device 5 disposed adjacent to the anode 3; electronic components such as the light-emitting device 2 and the protection device 5; wires W connecting between the anode 3 and the cathode 4, etc.; a light-reflecting resin 6 formed on the substrate 1; and a sealing member 7 with which the inside of the light-reflecting resin is filled.

<Substrate>

The substrate 1 is to arrange electronic components such as the light-emitting device 2 and the protection device 5. As shown in FIGS. 1 and 2, the substrate 1 has a rectangular planar shape. In addition, the substrate 1 is compartmentalized into a mounting region 1a so as to arrange a plurality of light-emitting devices 2 as illustrated in FIG. 2. Note that the size and shape of the substrate 1 is not particularly limited but can be appropriately selected depending on its purpose and usage including the number of light-emitting devices 2 and their arrangement interval.

<Mounting Region>

The mounting region 1a is to arrange a plurality of light-emitting devices 2. As shown in FIG. 2, the mounting region 1a is compartmentalized into a center region of the substrate 1. Along the left side of the mounting region 1a, the surrounding of the mounting region 1a has a portion of a wiring section 3b and a portion of a wiring section 4b when FIG. 2 is planarly viewed. In addition, a portion of the wiring section 4b is disposed along the bottom side of the mounting region 1a. Further, a relay wiring section 8 is disposed along the right side of the mounting region 1a. As used herein, the term "surrounding of the mounting region 1a" means a surrounding whose region is positioned at a predetermined distance from the periphery of the mounting region 1a.

The mounting region 1a may be a region which has been compartmentalized on the substrate 1 so as to arrange a plurality of light-emitting devices 2, that is, may be a region made of the same material as that of the substrate 1. Preferably, a metal film which reflects light is formed, for example, on the mounting region 1a, and a plurality of light-emitting devices 2 are disposed via the metal film. Light emitted toward the mounting region 1a of the substrate 1 can be reflected by the metal film deployed by, as described above, forming the metal film on the mounting region 1a and by disposing the plurality of light-emitting devices 2 thereon. Accordingly, this configuration can reduce loss of outgoing light and can enhance a light extraction efficiency of the light-emitting apparatus 100. Preferable examples of the material for the metal film include Ag (silver) and Au (gold). Particularly preferred is Ag. Au has light-absorbing characteristics. An optical reflectance, however, can be increased by, for example, coating the Au plating surface with an additional $TiO_2$ film. In addition, the optical reflectance of Ag is higher than that of Au. Accordingly, the light extraction efficiency of the light-emitting apparatus 100 can be increased by Ag plating rather than Au plating alone. Note that the thickness of the metal film formed on the mounting region 1a is not particularly limited but can be appropriately selected depending on its purpose and usage.

<Light-emitting Device>

A light-emitting device 2 is a semiconductor device which emits light by applying voltage. A plurality of light-emitting devices 2 are arranged on the mounting region 1a of the substrate 1 as shown in FIG. 2. The plurality of light-emitting devices 2 are integrated to constitute a light-emitting section 20 of the light-emitting apparatus 100. Note that the illustrated light-emitting section 20 just denotes a region on which the light-emitting devices 2 are disposed.

Each of the light-emitting devices 2 has a rectangular shape when FIG. 2 is planarly viewed. In addition, as illustrated in FIG. 2, the light-emitting device 2 is a face-up (FU) device in which a p-electrode 2a is disposed at a first side of the upper face and an n-electrode 2b is disposed at a second side thereof. In addition, a plurality of light-emitting devices 2 disposed on the mounting region 1a of the substrate 1 include first light-emitting devices 21 having a predetermined output and second light-emitting devices 22 having a lower output than that of the first light-emitting devices 21 (see FIG. 5). In order to reduce unevenness in brightness of the light-emitting apparatus 100, the structure and shape of the first light-emitting device 21 are preferably substantially the same as those of the second light-emitting device 22. Specifically, these light-emitting devices are preferably manufactured in the same manufacturing process using the same material.

Specifically, it is preferable to use, as the light-emitting device 2, a light-emitting diode which emits light having the same hue. Also, it is possible to select the light-emitting diode which emits light with a predetermined wavelength depending on its usage. Examples of blue (light with a wavelength of 430 to 490 nm) and green (light with a wavelength of 490 to 570 nm) light-emitting devices 2 that can be used include a nitride-based semiconductor ($In_XAl_YGa_{1-X-Y}N$, $0 \leq X$, $0 \leq Y$, $X+Y \leq 1$). Light-emitting devices which emit light having the same hue have a wavelength difference within preferably 20 nm, more preferably 15 nm, and still more preferably 10 nm. For example, a light-emitting device which emits light of 450 to 465 nm can be used. More preferably, a light-emitting device which emits light of 450 to 457.5 nm or of 457.5 to 460 nm can be used.

For example, the composition, emission color, and size of the light-emitting device 2 are not limited to the above but can be appropriately selected depending on its purpose. In addition, a flip-chip-mounting face-down light-emitting device and/or a light-emitting device with an opposing electrode structure can be used as the light-emitting device 2.

Note that it is preferable to classify the first light-emitting devices 21 and the second light-emitting devices 22 into the first light-emitting devices with a high output and the second light-emitting devices with a low output by using an average of outputs of the light-emitting devices 2 mounted on the light-emitting apparatus 100. Specifically, as described below, when the average of the outputs of the light-emitting devices 2 is set to "1", it is preferable to use a light-emitting device with an output of "1 to 1.2" as the first light-emitting device 21 and to use a light-emitting device with an output of "0.8 to 1" as the second light-emitting device 22.

In addition, an output difference between the first light-emitting device 21 and the second light-emitting device 22 which are next to each other in a row direction is determined. When the average of the outputs of the first light-emitting devices 21 and the second light-emitting devices 22 is set to "1", the difference is preferably "0.02 or more", more preferably "0.05 or more", and still more preferably "0.1 or more". In addition, in order to make light emission from the entire light-emitting apparatus 100 more uniform, the output difference between the light-emitting device 21 and the light-emitting device 22 which are next to each other in a row direction is preferably "0.4 or less", more preferably "0.3 or less", and still more preferably "0.2 or less". Also, it is preferable to use light-emitting devices having an output difference within "0.02 to 0.3" in particular. Note that such an output determination and classification are preferably carried out before the light-emitting devices 2 are mounted. The output can be determined by applying a constant current to each light-emitting device 2 while each light-emitting device 2 is connected neither in series nor in parallel.

<Light-emitting Device Layout>

As illustrated in FIG. 2, light-emitting devices are arranged at an equal distance in a row direction (horizontal direction) and in a column direction (vertical direction). Here, a total of 48 devices are arranged in 8 rows×6 columns (vertically 8 devices×horizontally 6 devices). This embodiment is taken as an example. In addition, as illustrated in FIG. 2, the light-emitting devices 2 which are adjacent to each other in a row direction with respect to the mounting region 1a are electronically connected in series with an electrically conductive wire W. As used herein, the term "serial connection (connected in series)" means a state in which a p-electrode 2a and an n-electrode 2b of the adjacent light-emitting devices 2 are electronically connected with a wire W.

As illustrated in FIG. 2, the light-emitting devices 2 are arranged between a relay wiring section 8 and a wiring section 3b of an anode 3, and p-electrodes 2a of the light-emitting devices 2 are directed toward a first direction, which is the left side, of the mounting region 1a. In addition, n-electrodes 2b of the light-emitting devices 2 are directed toward a second direction of the mounting region 1a. Also, as illustrated in FIG. 2, the light-emitting devices 2 are arranged between the relay wiring section 8 and a wiring section 4b of a cathode 4, and p-electrodes 2a of the light-emitting devices 2 are directed toward the second direction, which is the right side, of the mounting region 1a. In addition, n-electrodes 2b of the light-emitting devices 2 are directed toward the first direction, which is the left side. That is, when FIG. 2 is planarly viewed, the light-emitting devices 2 are turned 180 degrees with respect to the relay wiring section 8.

In a light-emitting apparatus 100 according to an embodiment, the relay wiring section 8 is formed along a portion of the surrounding of the mounting region 1a. Also, the light-emitting devices 2 are arranged and turned 180 degrees with respect to the relay wiring section. This configuration makes it possible to increase the number of the light-emitting devices 2 connected in series in a limited area of the mounting region 1a without complicating the wiring to connect the light-emitting devices 2 together. Further, it is also possible to closely arrange the light-emitting devices 2 in the limited area of the mounting region 1a to produce a light-emitting apparatus 100 in which power consumption is improved at certain brightness or to produce a light-emitting apparatus 100 in which a luminance efficiency is improved at certain power consumption.

Note that as illustrated in FIG. 2, a light-emitting apparatus 100 according to an embodiment has 6 serially connected light-emitting devices 2 at each of the upper and the lower section between the anode 3 and the cathode 4. For each section, 4 rows of the serial connection are formed. Further, the below-described relay wiring section serially connects between the upper and the lower section.

As illustrated in FIG. 2, in the light-emitting apparatus 100 according to this embodiment, the light-emitting devices 2 are arranged in row and column directions. And, the light-emitting devices 2 disposed in the row direction are connected in series. When the light-emitting devices 2 has such a layout of FIG. 2, inclusion of a light-emitting device 2 with a lower $V_f$ than other devices (hereinafter, referred to as a low $V_f$ device) and/or a light-emitting device 2 with a higher $V_f$ (hereinafter, referred to as a high $V_f$ device) in the light-emitting devices 2 can change a current flowing through the light-emitting devices in a corresponding row as a unit.

Figures 4A, 4B, 4C:
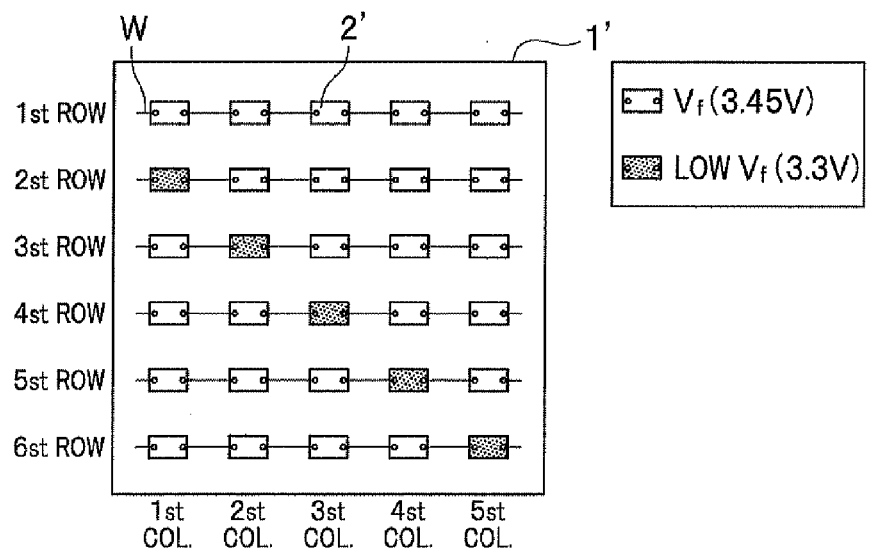
FIG. 4A schematically illustrates how to arrange the light-emitting devices.
FIG. 4B is a schematic diagram illustrating the results regarding a shunt current simulation of the light-emitting devices.
FIG. 4C is a schematic diagram illustrating a thermal distribution of the light-emitting devices.

The following describes a current change in the case of inclusion of a low $V_f$ device among light-emitting devices serially connected in a row direction by referring to FIG. 3 (the first pattern) and FIG. 4 (the second pattern). Note that for convenience of description, FIG. 3 and FIG. 4 show a layout having a total of 30 light-emitting devices 2' in 6 rows×5 columns on a substrate 1'. The light-emitting devices 2' are connected in series in each row and the first to sixth rows are connected in parallel. In addition, in FIGS. 3 and 4, the regular light-emitting devices 2' have a $V_f$ of 3.45 V, and the low $V_f$ devices have a $V_f$ of 3.3 V. Meanwhile, in FIGS. 3B and 4B, the numbers denote a current (mA). In FIGS. 3C and 4C, the numbers denote a relative temperature of light-emitting devices.

As illustrated in FIG. 3A, in the first pattern, all of the devices in the 6th row are the low $V_f$ devices. In this case, in order to flow a current of 120 mA through each light-emitting device 2', a current of 720 mA is applied to all of the first to sixth rows which have been connected in parallel. As illustrated in FIG. 3B, a current of 114 mA flows through the light-emitting devices 2' which have been disposed in the first to fifth rows. A current of 149 mA flows through the light-emitting devices 2' which have been disposed in the sixth row. That is, inclusion of the low $V_f$ devices in the light-emitting devices 2' increases a current which flows through an entire row including the low $V_f$ devices. In addition, a current which flows through an entire row free of the low $V_f$ devices decreases. As a result, as illustrated in FIG. 3B, a current is deviated. In contrast, inclusion of the high $V_f$ devices in the light-emitting devices 2' decreases a current which flows through an entire row including the high $V_f$ devices. In addition, a current which flows through an entire row free of the high $V_f$ devices increases. Accordingly, as likewise illustrated in the FIG. 3B, a current is deviated.

Then, occurrence of such a current deviation increases a light output of the sixth row through which a higher current flows. In addition, it lowers light outputs of the first to fifth rows through which a lower current flows. This causes unevenness in brightness of the light-emitting apparatus. Meanwhile, FIG. 3B shows the results of a shunt current simulation. When a light-emitting apparatus is built and its thermal distribution is examined, an overall temperature of the sixth row is demonstrated to increase compared to that of the first row. When there is no current deviation, a position at or near the center where the light-emitting devices 2' are concentrated has the highest temperature. As the position moves farther from the center, the temperature falls. Since deviation can be observer in a thermal distribution as described above, it is thought that the actual current deviation occurs as illustrated in FIG. 3B.

Next, as illustrated in FIG. 4A, the second pattern is the case in which a low $V_f$ device is included in each of the second to sixth rows. This case presumes that the low $V_f$ devices are included at random. In this case, in order to flow a current of 120 mA through each light-emitting device 2' in substantially the same manner as in the first pattern, a current of 720 mA is applied to all of the first to sixth rows which have been connected in parallel. As illustrated in FIG. 4B, a current of 115 mA flows through the light-emitting devices 2' which have been disposed in the first row. A current of 121 mA flows through the light-emitting devices 2' which have been disposed in the second to sixth rows. In this case, an overall current flowing through the rows containing a low $V_f$ device increases, and an overall current flowing through the row free of a low $V_f$ device decreases. This causes a current deviation. However, since the number of rows containing the low $V_f$ device is large as illustrated in FIG. 4B, the current deviation is less than that of the first pattern. In addition, FIG. 4B shows the results of a shunt current simulation. When a light-emitting apparatus is built and its thermal distribution is examined, it can be demonstrated that the temperature is moderately increased throughout the second to sixth rows as illustrated in FIG. 4C. Because of the above, an actual current deviation seems to occur as illustrated in FIG. 4B.

Likewise, when a plurality of rows having serially connected devices are arranged and these rows are connected in parallel, inclusion of either a low or high $V_f$ device in the light-emitting devices 2 causes a current deviation in the respective rows. Here, the $V_f$ of the light-emitting device 2, as well as its output, can be measured in advance. Accordingly, the $V_f$ of the light-emitting device 2 can be classified into several ranks beforehand. Then, while the $V_f$ as well as their output are taken into account, only the devices with a specific rank can be used to arrange the light-emitting devices 2 on the substrate 1. But, if the $V_f$ and output are classified into several ranks and devices with a rank other than the specific rank are excluded, the yield of the light-emitting devices 2 is markedly lowered. Consequently, a method should be employed which can minimize an effect of current deviation caused by the light-emitting devices 2 with different $V_f$ values without classifying the $V_f$ into several ranks.

Figure 5A:
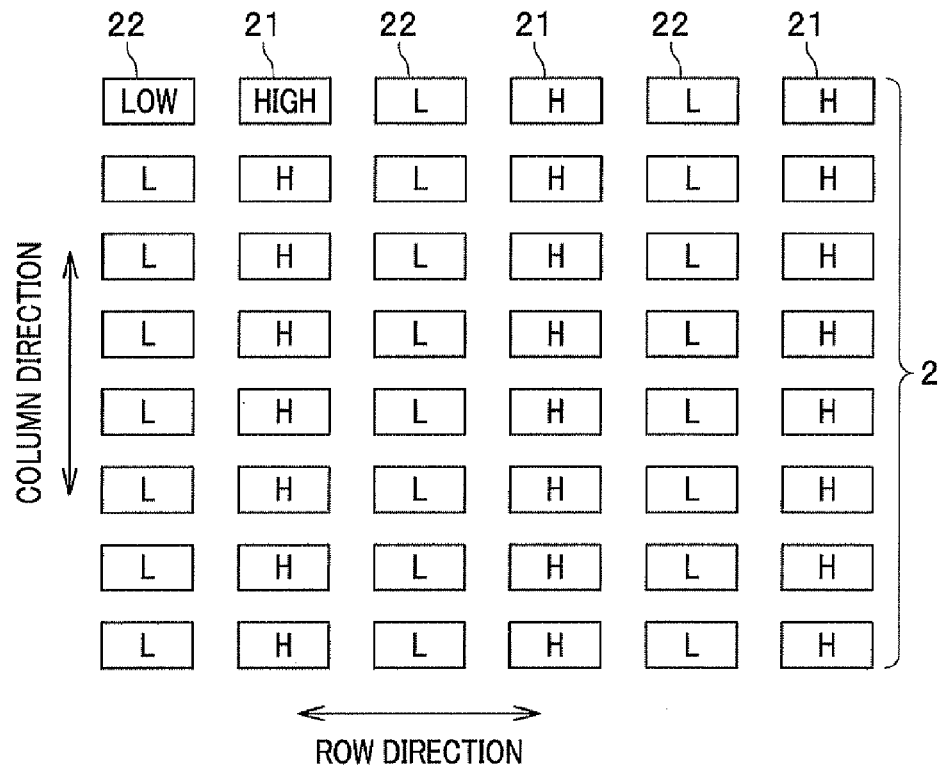
FIG. 5A is a layout in the case of having 8 rows×6 columns.

As used herein, the light-emitting apparatus 100 according to this embodiment includes a plurality of light-emitting devices 2 consisting of the first light-emitting devices 21 having a predetermined output and the second light-emitting devices 22 having a lower output than that of the first light-emitting devices 21. In addition, as illustrated in FIG. 5A, the first light-emitting device 21 and the second light-emitting device 22 are alternately disposed in a row direction. That is, as illustrated in FIG. 5A, from the first row and the first column are alternately disposed, in sequence in a row direction, the second light-emitting device 22 having a lower output and the first light-emitting device having a higher output. Accordingly, the light-emitting devices 2 are arranged so as to alternately change their outputs in the row direction.

The following is a case of including a low $V_f$ device in light-emitting devices 2 and describes a relationship between the arrangement and the outputs of the first light-emitting devices 21 and the second light-emitting devices 22 by referring to FIG. 6 (the first pattern) and FIG. 7 (the second pattern). Note that for convenience of description, FIGS. 6 and 7 show a layout of 16 light-emitting devices 2 (the first light-emitting devices 21 and the second light-emitting devices 22) in 4 rows×4 columns on the substrate 1. The light-emitting devices 2 are serially connected in a row direction, and a plurality of the row directions are connected in parallel. The number designated in each box of the first light-emitting devices 21 and the second light-emitting devices 22 in FIGS. 6 and 7 denotes a light output.

As illustrated in FIG. 6A, the first pattern is a case in which the first light-emitting devices 21 having a higher output and the second light-emitting devices 22 having a lower output are alternately arranged in a column direction. In this case, when a low $V_f$ device is included in the second row and a high $V_f$ device is included in the third row as shown in FIG. 6B, for example, an overall current flowing through the second row increases and an overall current flowing through the third row decreases. Accordingly, as illustrated in FIG. 6B, averages of the light outputs from the first to fourth rows markedly vary, so that their unevenness in brightness become large.

In addition, when low $V_f$ devices are included in the first and third rows and high $V_f$ devices are included in the second and fourth rows as shown in FIG. 6C, for example, an overall current flowing through the first and third rows increases and an overall current flowing through the second and fourth rows decreases. In this case, the unevenness in brightness is reduced, but such a condition rarely occurs by chance. In order to intentionally realize the condition shown in FIG. 6C, the $V_f$ of the light-emitting devices 2 should be classified into several ranks as described above and the devices with a specific rank should be used. This causes the yield to markedly decrease.

Accordingly, the above is totally taken into consideration. When the first light-emitting devices 21 having a higher output and the second light-emitting devices 22 having a lower output are alternately disposed in a column direction, the light output in a row direction is uniformly changed, so that a difference in a brightness distribution among the light-emitting apparatuses becomes large. In view of the above, inclusion of a low $V_f$ device or a high $V_f$ device is found to produce a relatively larger influence on the light output.

Next, as illustrated in FIG. 7A, the second pattern is a case in which the first light-emitting device 21 having a higher output and the second light-emitting device 22 having a lower output are alternately arranged in a row direction. In this case, when a low $V_f$ device is included in the second row and a high $V_f$ device is included in the third row as shown in FIG. 7B, for example, an overall current flowing through the second row increases and an overall current flowing through the third row decreases. Because the first light-emitting device 21 having a higher output and the second light-emitting device 22 having a lower output are alternately disposed, their brightness is not concentrated in a particular location and is dispersed. This can reduce the unevenness in brightness. In addition, as illustrated in FIG. 7B, averages of the light outputs from the first to fourth rows less vary, so that a difference in a brightness distribution among the light-emitting apparatuses seems unlikely to become large.

In addition, when low $V_f$ devices are included in the first and second rows and high $V_f$ devices are included in the third and fourth rows as shown in FIG. 7C, for example, an overall current flowing through the first and second rows increases and an overall current flowing through the third and fourth rows decreases. However, as illustrated in FIG. 7C, the brightness is not concentrated in a particular location and is dispersed. In addition, averages of the light outputs from the first to fourth rows less vary, so that a difference in a brightness distribution among the light-emitting apparatuses seems unlikely to become large.

Accordingly, the above is totally taken into consideration. When the first light-emitting device 21 having a higher output and the second light-emitting device 22 having a lower output are alternately disposed in a row direction, inclusion of a low $V_f$ device or a high $V_f$ device is found to produce a relatively smaller influence on the light output than the case of alternately arranging those devices in a column direction.

In view of the above reasons, the light-emitting apparatus 100 according to this embodiment has a layout with the first light-emitting devices 21 and the second light-emitting devices 22 as shown in FIG. 5A. In addition, it is preferable that the light-emitting apparatus 100 includes at least one row in which an average of forward voltages of the light-emitting devices 2 differs from that of another row.

This configuration can reduce the unevenness in brightness of a light-emitting apparatus according to this embodiment by using serial and parallel connections. In addition, when light-emitting devices 2 include a light-emitting device 2 with a different $V_f$, a row containing the light-emitting device 2 with a different $V_f$ may have an increased or decrease current flow. Even in that case, the light outputs in the row direction do not become uniformly high or low because two types of light-emitting device 2 having different outputs are alternately disposed in the row direction in which the light-emitting devices 2 are connected in series. The light outputs can also be dispersed in the row direction. In addition, even if the light-emitting devices 2 include a light-emitting device 2 with a different $V_f$, the light-emitting device with a different output is likely to be dispersed as a whole. As a result, bright and/or dark spots are hardly concentrated in a particular row, which can be unlikely to develop unevenness in brightness as a whole. Also, the above configuration makes it possible to reduce a difference in a brightness distribution among the light-emitting apparatuses 100.

Furthermore, it is preferable that in the light-emitting apparatus 100 according to this embodiment, the first light-emitting device 21 and the second light-emitting device 22 are alternately disposed in a row direction as well as the first light-emitting devices 21 and the second light-emitting devices 22 are continuously disposed in a column direction as illustrated in FIG. 5A. That is, it is preferable that in the light-emitting apparatus 100, the light-emitting devices 2 having the same output are arranged in a column direction as illustrated in FIG. 5A.

This configuration makes it possible to precisely arrange the light-emitting devices 2 in a light-emitting device arrangement step during the below-described process of manufacturing a light-emitting apparatus 100 according to this embodiment.

Figure 5B:
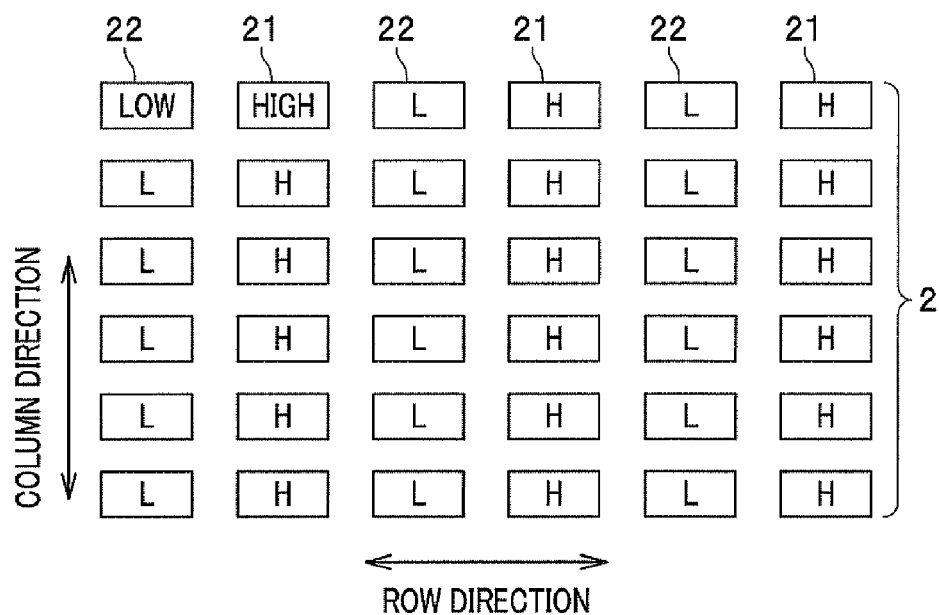
FIG. 5B is a layout in the case of having 6 rows×6 columns.

Moreover, it is preferable that in the light-emitting apparatus 100 according to this embodiment, the numbers of the first light-emitting devices 21 and the second light-emitting devices 22 which are alternately disposed in each row direction are the same as illustrated in FIG. 5.

When the light-emitting apparatus 100 according to this embodiment includes a light-emitting device 2 with a different $V_f$ among the light-emitting devices 2, a row containing the light-emitting device 2 with a different $V_f$ may have an increased or decreased current flow. Even in that case, such a configuration makes it possible to uniformly disperse the light-emitting devices 2 with different outputs because the numbers of two types of the light-emitting devices 2 in a row direction are the same and the devices are evenly arranged. This can reduce unevenness in brightness of the light-emitting apparatus 100.

<Anode and Cathode>

An anode 3 and a cathode 4 electrically connect between an external power source (not shown) and electronic components such as light-emitting devices 2 and a protection device 5 on a substrate 1. The anode 3 and the cathode 4 are to apply voltage to these electronic components from the external power source. That is, the anode 3 and the cathode 4 can serve as an electrode or a part thereof to permit conduction from the external source.

The anode 3 and the cathode 4 have a metal member on the substrate 1 as illustrated in FIG. 2. The anode 3 and the cathode 4 include substantially rectangular pad sections (power supply sections) 3a and 4a and linear wiring sections 3b and 4b. The voltage applied to the pad sections 3a and 4a is applied via the wiring sections 3b and 4b to a light-emitting section 20 including light-emitting devices 2. Note that the wiring section 4b of the cathode 4 has a cathode mark CM which denotes a cathode as shown in FIG. 2.

Voltage is applied to the pad sections 3a and 4a from the external power source. The pad sections 3a and 4a which are positioned diagonally at the corners on the substrate 1 are formed as a pair as illustrated in FIG. 2. Then, the pad sections 3a and 4a are electrically connected with the external power source (not shown).

The wiring sections 3b and 4b are to deliver the voltage applied to the pad sections 3a and 4a from the external power source to the light-emitting devices 2 on the mounting region 1a. The wiring sections 3b and 4b are projected from the pad sections 3a and 4b as illustrated in FIG. 2, and are formed surrounding the mounting region 1a as a substantially L-shaped structure.

It is preferable to use Au as a material for the metal member constituting the anode 3 and the cathode 4. This is because when Au having increased heat conductivity is used as a material for a wire W, the Au-made wire W can be tightly attached thereto.

<Light-reflecting Resin>

A light-reflecting resin 6 is to reflect light emitted from the light-emitting device 2. The light-reflecting resin 6 is formed covering portions of the wiring sections 3b and 4b, the relay wiring section 8, the protection device 5, and the wires W connecting these components as illustrated in FIG. 2. When Au, which readily absorbs light as described above or below, is used to produce the wiring sections 3b and 4b, the relay wiring section 8, and the wires W, the above configuration makes it possible to reflect light, emitted by the light-emitting device 2, by the light-reflecting resin 6 while the light does not reach the wiring sections 3b and 4b, the relay wiring section 8, or the wires W. Note that the light-reflecting resin 6 may be unnecessary. For example, a substrate with a concave region is used as the substrate 1; the light-emitting devices 2 are placed at the bottom of the concave region; and the inner wall surface of the concave region can be used as a light-reflecting surface.

In addition, as illustrated in FIGS. 1 and 2, the light-reflecting resin 6 is formed surrounding the light-emitting devices 2 on the substrate 1. Specifically, the light-reflecting resin 6 is formed as a rectangular frame surrounding the mounting region 1a having the light-emitting section 20. This configuration makes it possible for the light-reflecting resin 6 to reflect light directed to the surrounding of the mounting region 1a on the substrate 1.

It is preferable to use an insulating material as a material for the light-reflecting resin 6. In order to retain strength in some degrees, a thermoset resin and/or a thermoplastic resin, for example, can be employed. More specific examples include a phenolic resin, an epoxy resin, a BT resin, PPA, and a silicon resin. Note that the size of the light-reflecting resin 6 is not particularly limited but can be appropriately selected depending on its purpose and usage.

<Sealing Member>

A sealing member 7 is to protect, for example, the light-emitting devices 2, the protection device 5, and the wires W deployed on the substrate 1 from dust, water, external force, etc. The sealing member 7 is created by filling the mounting region 1a surrounded by the light-reflecting resin 6 on the substrate 1 with a resin as illustrated in FIGS. 1 and 2. It is preferable to use, as a material for the sealing member 7, a transparent material which can permit light from the light-emitting device 2. Specific examples of the material can include a silicon resin, an epoxy resin, and a urea resin.

<Relay Wiring Section>

A relay wiring section 8 is to relay the wirings between the anode 3 and the cathode 4. The relay wiring section 8 has a metal member on the substrate 1 as illustrated in FIG. 2. As shown in FIG. 2, the linear relay wiring section 8 is formed along a first side of the surrounding of the mounting region 1a, namely the right side.

In a manner similar to the anode 3 and the cathode 4, Au is preferably used as a material for the metal member constituting the relay wiring section 8.

According to the light-emitting apparatus 100 including the above components, a plurality of light-emitting devices 2 are arranged in row and column directions, and the light-emitting devices 2 may contain light-emitting devices with different $V_f$ values. Even in that case, the light-emitting devices with various outputs can be dispersed in the row and column directions, thereby decreasing a brightness deviation. In addition, it is possible to reduce unevenness in brightness of the light-emitting apparatus and a difference in a brightness distribution among the light-emitting apparatuses.

In addition, the light-emitting apparatus 100 can reduce the unevenness in brightness of the light-emitting apparatus 100 and the difference in the brightness distribution among the light-emitting apparatuses 100. Thus, it is unnecessary to select the light-emitting devices 2 according to the $V_f$. That is, it is unnecessary to classify the $V_f$ of the light-emitting devices 2 into several ranks to eliminate devices with ranks other than a specific rank. Hence, the yield of the light-emitting devices 2 can be increased, so that a cost increase can be avoided.

In addition, an average of outputs of the light-emitting devices 2 tends to vary among their manufacturing lots. Accordingly, when the light-emitting devices 2 are classified into multiple ranks by using their outputs as a standard, the devices are likely to be classified and deviated depending on each manufacturing lot. Furthermore, an average of the $V_f$ values of the light-emitting devices 2 also tends to vary among their manufacturing lots. When the first light-emitting devices 21 and the second light-emitting devices 22 are arranged in a manner illustrated in FIG. 6A, for example, high $V_f$ devices may be concentrated in a row containing the second light-emitting devices 22 with a lower output and low $V_f$ devices may be concentrated in a row containing the first light-emitting devices 21 with a higher output. In contrast, as illustrated in FIG. 7A, the light-emitting apparatus 100 has a layout in which the light-emitting devices 2 with different manufacturing lots, namely the different $V_f$ values, are mixed. This configuration can make it unlikely to generate a difference in the average $V_f$ in each row. The current deviation in a particular row therefore can be lessened.

[Method for Manufacturing Light-emitting Apparatus]

The following gives a brief description on a method for manufacturing a light-emitting apparatus 100 according to the first embodiment of the present invention. The method for manufacturing a light-emitting apparatus 100 includes a substrate-producing step, a plating step, a light-emitting device arrangement step, a protection-device-connecting step, a wire-bonding step, a light-reflecting-resin-formation step, and a sealing-member-filling step.

<Substrate-producing Step>

The substrate-producing step is a step of producing a substrate 1 having wiring for plating. In the substrate-producing step, a mounting region 1a, an anode 3, and a cathode 4 on the substrate 1 are subjected to patterning into a predetermined shape for production. In addition, in the substrate-producing step, plating is performed to produce the wiring for plating to coat the mounting region 1a on the substrate 1 with a metal film.

<Plating Step>

The plating step is a step of forming a metal member including at least the anode 3 and the cathode 4 on the substrate 1 having the wiring for plating. Preferably, the step includes: forming a metal member including the anode 3 and the cathode 4 by using non-electrolytic plating; and forming a metal film on the mounting region 1a on the substrate 1 by using electrolytic plating. In addition, when the relay wiring section 8 is provided, the metal member is produced using a step similar to that used for the anode 3 and the cathode 4.

<Light-emitting Device Classification Step>

The light-emitting device classification step is a step of classifying light-emitting devices emitting the same hue into a plurality of ranks depending on the brightness of each light-emitting device. In the first embodiment, the devices are classified into the first group and the second group having a lower output than that of the first group. In this case, a constant current is made to pass through each light-emitting device 2, and its output is determined. Then, by using an average of its output as a borderline, the devices can be classified into the first group having a higher output and the second group having a lower output. For example, provided that the emission wavelength is within 450 to 452.4 nm and the average of its output is 1, the light-emitting devices 2, whose output distribution fits within about 0.8 to 1.2, are classified into the first group having a higher output and the second group having a lower output by using the average of 1 as a borderline. Note that the classification of each group may use criteria of brightness when a constant current is made to pass through each light-emitting device 2. In addition to the output, a luminous intensity and/or emission power may be measured. Then, they can be used to classify the devices. In addition, the classification can be made using a numerical value as obtained by multiplying lightness, such as a luminous intensity of the light-emitting device 2, by a transform using a wavelength, etc.

Also, the number of classification groups may be three or more. For example, the devices are classified into the first group with a high output, the third group having a medium output, and the second group having a low output. Then, in the below-described light-emitting device arrangement step, the first light-emitting devices 21 selected from the first group and the second light-emitting devices 22 selected from the second group can be employed. Preferably, provided is a pair of groups whose subjects are distributed depending on the desired output as the center. Then, the respective light-emitting devices 2 are selected from the pair of groups. After that, the devices are arranged on a substrate to be connected in series as described below. Note that the light-emitting device classification step can be carried out before the substrate-producing step and/or the plating step.

<Light-emitting Device Arrangement Step>

The light-emitting device arrangement step is a step of arranging the light-emitting devices 2 on the substrate 1 (metal film). The light-emitting device arrangement step includes: placing light-emitting devices 2 over a metal film on the mounting region 1a via an attachment member; causing the light-emitting devices 2 to attach to the metal film on the mounting region 1a; and arranging the light-emitting devices 2 over the substrate 1. Specifically, in the light-emitting device arrangement step, the first light-emitting devices 21 selected from the first group and the second light-emitting devices 22 selected from the second group are disposed in row and column directions, and the first light-emitting device 21 and the second light-emitting device 22 are alternately positioned and arranged in each row direction.

In addition, it is preferable that the light-emitting device arrangement step includes: the first step of arranging the first light-emitting devices 21 in column directions as illustrated in FIG. 8A; and the second step of arranging the second light-emitting devices 22 in column directions adjacent to those of the first light-emitting devices 21 which have been positioned at the first step. Such a configuration can make it easier to accurately arrange the first light-emitting devices 21 and the second light-emitting devices 22 with different outputs on the substrate 1.

<Protection-device-connecting Step>

The protection-device-connecting step is a step of disposing and connecting the protection device 5 on the wiring section 3b of the anode 3. A method for disposing and connecting the protection device 5 is substantially the same as in the light-emitting device arrangement step. Here, the description is thus omitted.

<Wire-bonding Step>

The wire-bonding step is a step including: connecting between the light-emitting devices 2 with a wire W after the light-emitting device arrangement step; and electrically connecting the light-emitting devices 2 to either the anode 3 or the cathode 4 with wires W. More specifically, first, the wire-bonding step includes electrically connecting a p-electrode 2a or an n-electrode 2b of the first light-emitting device 21 disposed in a row direction to an n-electrode 2a or a p-electrode 2b of the second light-emitting device 22, respectively, with a wire W, so that the light-emitting devices disposed in the row direction are connected one another in series. Then, the wire W is used to electrically connect the wiring section 3b of the anode 3 made of a metal member to the p-electrode 2a of either the first light-emitting device 21 or the second light-emitting device 22 that becomes a first terminal of each row containing the serially connected devices. Also, the wire W is used to electrically connect the wiring section 4b of the cathode 4 made of a metal member to the n-electrode 2b of either the first light-emitting device 21 or the second light-emitting electrode 22 that becomes a second terminal of each row. This makes it possible to connect the respective rows in parallel.

This step may be employed to electrically connect between the protection device 5 and the cathode 4. Specifically, a wire W is used to connect the wiring section 4b of the cathode 4 to an n-electrode of the protection device 5. Note that the connection procedure using the wire W is not particularly limited but may be carried out by a common procedure.

<Light-reflecting-resin-formation Step>

The light-reflecting-resin-formation step is a step of covering the relay wiring section 8 and at least a part of the wiring sections 3b and 4b along the periphery of the mounting region 1a with a light-reflecting resin 6 after the wire-bonding step. The light-reflecting resin 6 can be formed, for example, using a resin-discharging apparatus which can move (movable) in a vertical or a horizontal direction with respect to the substrate 1 over the top of the fixed substrate 1 (see, JP2009-182307A).

<Sealing-member-filling Step>

The sealing-member-filling step is a step of filling the inside of the light-reflecting resin 6 with a transparent sealing member 7 which covers the light-emitting devices 2 and the metal film. Specifically, the step includes: injecting a resin into the interior of a wall section made of the light-reflecting resin 6 formed on the substrate 1; and causing the resin to cure by the subsequent heating and/or light irradiation to produce the sealing member 7 which covers the light-emitting devices 2, the protection device 5, and the metal film and the wires W, etc., on the mounting region 1a.

[Second Embodiment]

The following details a light-emitting apparatus according to the second embodiment by referring to FIG. 9. The light-emitting apparatus according to the second embodiment includes substantially the same configuration as in the light-emitting apparatus 100 according to the above-described first embodiment except for the arrangement of the light-emitting devices 2 (the first light-emitting devices 21 and the second light-emitting devices 22) as illustrated in FIG. 9. Hence, the description of the configuration which overlaps with that of the above light-emitting apparatus 100 is omitted.

Figure 9A:
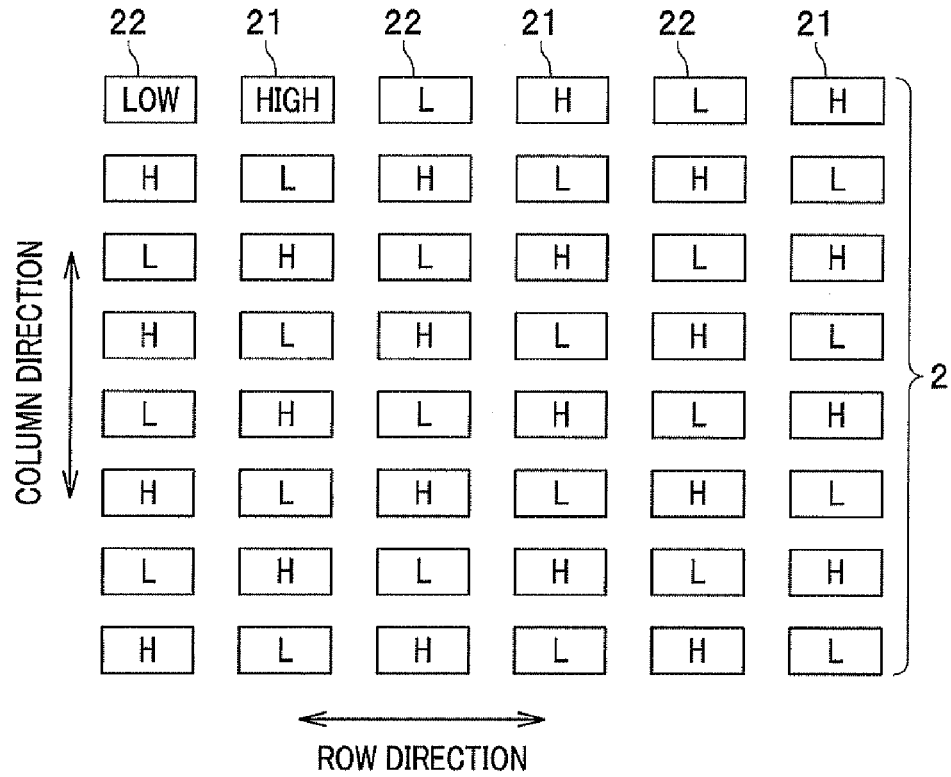
FIG. 9A is a layout in the case of having 8 rows×6 columns.

In the light-emitting apparatus according to the second embodiment, the first light-emitting device 21 and the second light-emitting device 22 are alternately disposed in a row direction as well as the first light-emitting device 21 and the second light-emitting device 22 are alternately disposed in a column direction as illustrated in FIG. 9A. Specifically, as illustrated in FIG. 9A, the first light-emitting devices 21 and the second light-emitting devices 22 are alternately disposed from the first row and the first column (the top left end) in a row direction in the order from the second light-emitting device 22 to the first light-emitting device 21. This arrangement makes it possible to alternately modify the outputs of the light emitting devices 2 in the row direction. In addition, these light-emitting devices are alternately disposed from the first row and the first column (the top left end) in a column direction in the order from the second light-emitting device 22 to the first light-emitting device 21. This configuration makes it possible to alternately modify the outputs of the light-emitting devices 2 in the column direction.

In view of the above, when the light-emitting apparatus according to this embodiment include a light-emitting device 2 with a different $V_f$ in the light-emitting devices 2, a row containing the light-emitting device 2 with a different $V_f$ may have an increased or decreased current flow. Even in that case, the light outputs in the row and column directions do not become uniformly high or low because the light-emitting devices 2 with different outputs are alternately disposed not only in the row direction in which the light-emitting devices 2 are connected in series but also in the column direction. This can also disperse the light outputs in the row and column directions. Furthermore, even if the light-emitting devices 2 include a light-emitting device 2 with a different $V_f$, bright and/or dark spots are hardly concentrated in a particular row or column, which can reduce unevenness in brightness as a whole.

Figure 9B:
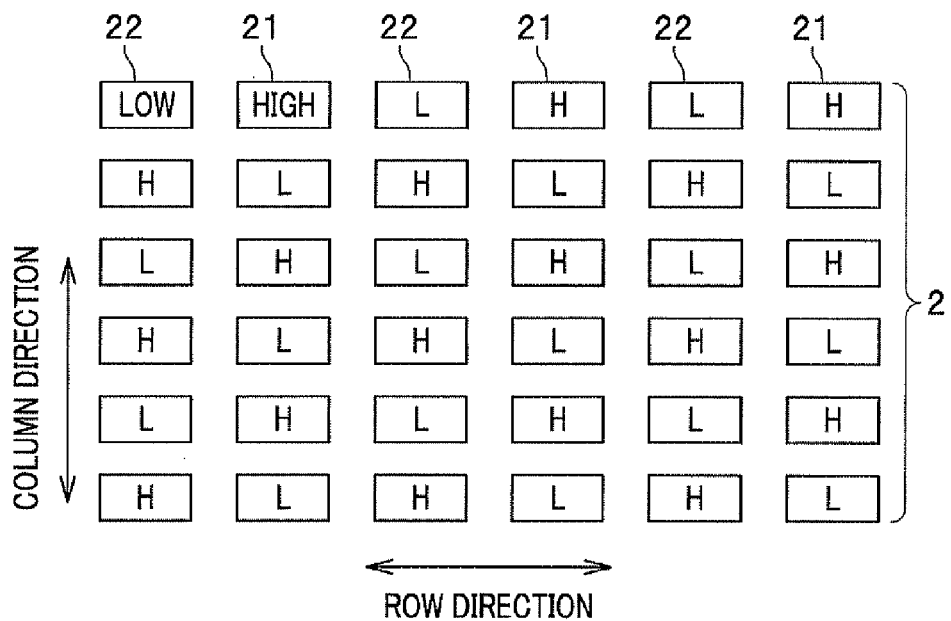
FIG. 9B is a layout in the case of having 6 rows×6 columns.

In addition, in the light-emitting apparatus according to this embodiment, the number of the light-emitting devices 2 in a row direction is the same as the number of the light-emitting devices 2 in a column direction as illustrated in FIG. 9B. In addition, it is preferable that the numbers of the first light-emitting devices 21 and the second light-emitting devices 22 which are alternately disposed in each row direction are the same.

When the light-emitting apparatus according to this embodiment includes a light-emitting device 2 with a different $V_f$ among the light-emitting devices 2, a row containing the light-emitting device 2 with a different $V_f$ may have an increased or decreased current flow. Even in that case, such a configuration makes it possible to uniformly disperse the light-emitting devices 2 with different outputs because the numbers of two types of the light-emitting devices are the same in the row and column directions and the devices are evenly arranged. This can reduce unevenness in brightness of the light-emitting apparatus.

Note that the light-emitting device arrangement step in the process of manufacturing the light-emitting apparatus according to the second embodiment includes: the first step of arranging the first light-emitting devices 21 in an every other column direction; and the second step of arranging the second light-emitting devices 22 in an every other column direction which is adjacent to that of the first light-emitting devices 21 arranged in the first step. By doing so, the first light-emitting devices 21 and the second light-emitting devices 22 are arranged on the substrate 1.

[Third Embodiment]

Figure 10A:
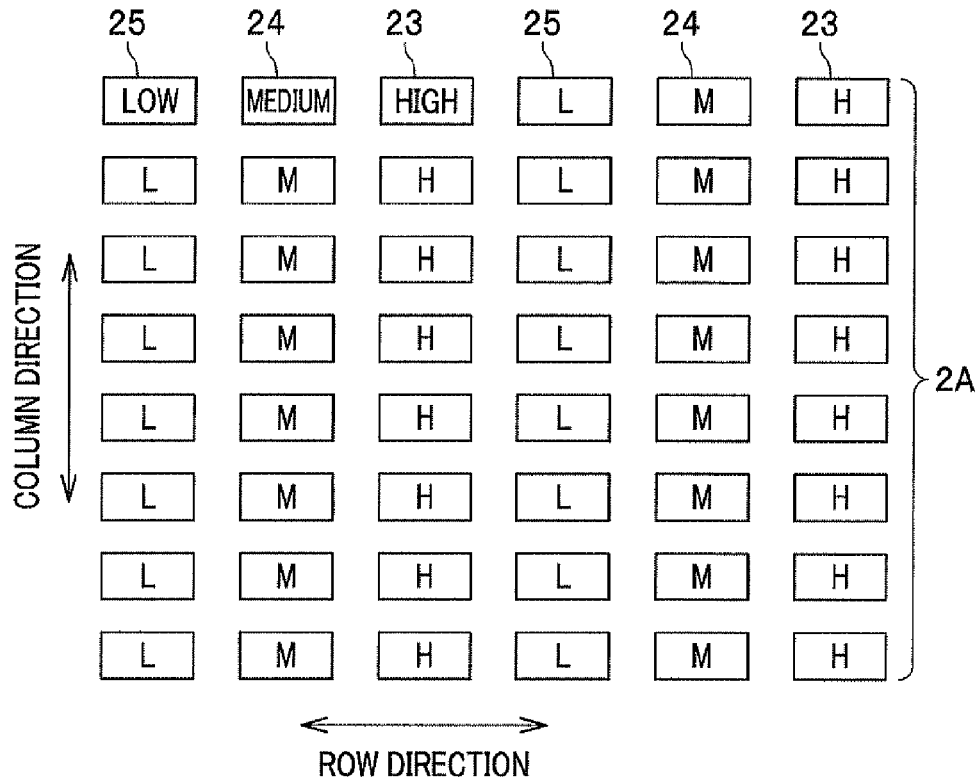
FIG. 10A is a layout in the case of having 8 rows×6 columns.
Figure 10B:
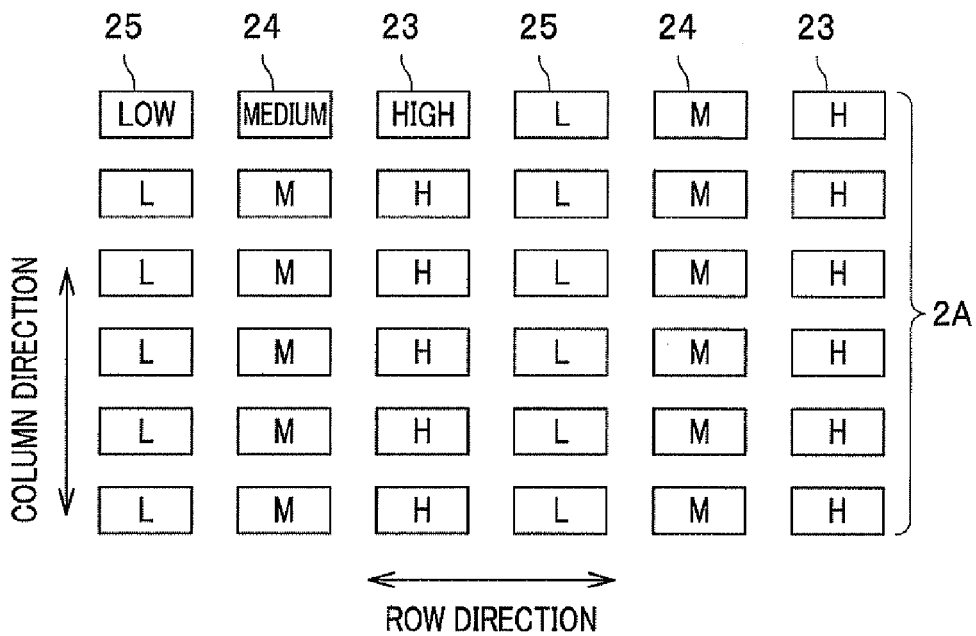
FIG. 10B is a layout in the case of having 6 rows×6 columns.

The following details a light-emitting apparatus according to the third embodiment by referring to FIG. 10. The light-emitting apparatus according to the third embodiment includes substantially the same configuration as in the light-emitting apparatus 100 according to the above-described first embodiment except for the configuration and arrangement of light-emitting devices 2A (the first light-emitting devices 23, the second light-emitting devices 24, and the third light-emitting devices 25) as illustrated in FIG. 10. Hence, the description of the configuration which overlaps with that of the above light-emitting apparatus 100 is omitted.

The light-emitting devices 2A of the light-emitting apparatus according to the third embodiment includes: the first light-emitting devices 23 having a predetermined output; the second light-emitting devices 24 having a lower output than that of the first light-emitting devices 23; and the third light-emitting devices 25 having a lower output than that of the second light-emitting devices 24. In the light-emitting apparatus according to this embodiment, the first light-emitting devices 23, the second light-emitting devices 24, and the third light-emitting devices 25 are arranged in a row direction in a predetermined order as illustrated in FIG. 10A. That is, as illustrated in FIG. 10A, from the first row and the first column are alternately disposed, in sequence in a row direction, the third light-emitting device 25 having a low output, the second light-emitting device 24 having a medium output, and the first light-emitting device having a high output. Accordingly, the light-emitting devices 2A are arranged so as to change their outputs in the row direction in the predetermined order.

When the light-emitting apparatus according to this embodiment includes a light-emitting device 2A with a different $V_f$ among the light-emitting devices 2A, a row containing the light-emitting device 2A with a different $V_f$ may have an increased or decreased current flow. Even in that case, the light outputs in the row direction do not become uniformly high or low because the light-emitting devices 2A with different outputs are disposed in the predetermined order in the row direction in which the light-emitting devices 2A are connected in series. This can reduce unevenness in brightness of the light-emitting apparatus in the row direction. In addition, even if the light-emitting devices 2A include a light-emitting device 2A with a different $V_f$, the light-emitting device with a different output is likely to be dispersed as a whole. As a result, bright and/or dark spots are hardly concentrated in a particular row, which can reduce unevenness in brightness as a whole. Also, the above configuration makes it possible to reduce a difference in a brightness distribution among the light-emitting apparatuses.

Furthermore, it is preferable that in the light-emitting apparatus according to this embodiment, the first light-emitting devices 23, the second light-emitting devices 24, and the third light-emitting devices 25 are disposed in a row direction in a predetermined order as well as the first light-emitting devices 23, the second light-emitting devices 24, and the third light-emitting devices 25 are continuously disposed in a column direction as illustrated in FIG. 10A. That is, it is preferable that in the light-emitting apparatus, the light-emitting devices 2A having the same output are arranged in each column direction as illustrated in FIG. 10A.

This configuration makes it easier to precisely arrange the light-emitting devices 2A on the substrate 1 in the light-emitting device arrangement step during the above-described process of manufacturing the light-emitting apparatus according to this embodiment.

Moreover, it is preferable that in the light-emitting apparatus 100 according to this embodiment, the numbers of the first light-emitting devices 23, the second light-emitting devices 24, and the third light-emitting devices 25 which are disposed in each row direction in the predetermined order are the same as illustrated in FIG. 10.

When the light-emitting apparatus according to this embodiment includes a light-emitting device 2A with a different $V_f$ among the light-emitting devices 2A, a row containing the light-emitting device 2A with a different $V_f$ may have an increased or decreased current flow. Even in that case, such a configuration makes it possible to uniformly disperse the light-emitting devices 2A with different outputs because the numbers of three types of the light-emitting devices 2A are the same in each row direction and the devices are evenly arranged. This can reduce unevenness in brightness of the light-emitting apparatus.

[Fourth Embodiment]

The following details a light-emitting apparatus according to the fourth embodiment by referring to FIG. 11. The light-emitting apparatus according to the fourth embodiment includes substantially the same configuration as in the light-emitting apparatus according to the above-described third embodiment except for the arrangement of light-emitting devices 2A (the first light-emitting devices 23, the second light-emitting devices 24, and the third light-emitting devices 25) as illustrated in FIG. 11. Hence, the description of the configuration which overlaps with that of the above light-emitting apparatus according to the third embodiment is omitted.

Figure 11A:
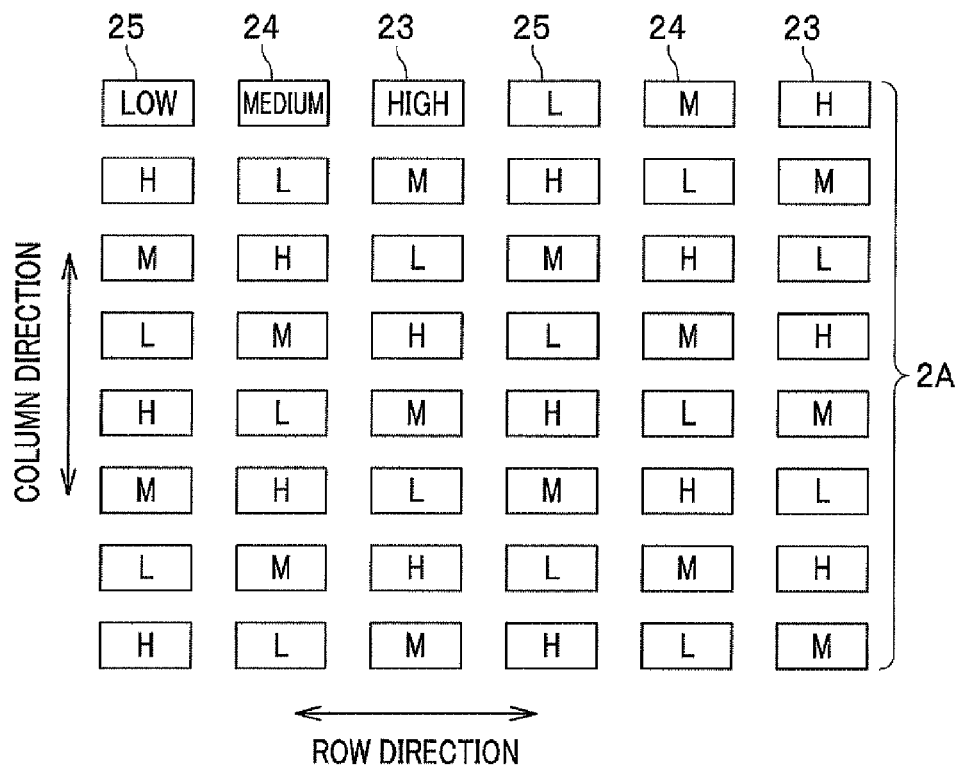
FIG. 11A is a layout in the case of having 8 rows×6 columns.

In the light-emitting apparatus according to the fourth embodiment, the first light-emitting devices 23, the second light-emitting devices 24, and the third light-emitting devices 25 are disposed in a row direction in a predetermined order as well as the first light-emitting devices 23, the second light-emitting devices 24, and the third light-emitting devices 25 are disposed in a column direction in a predetermined order as illustrated in FIG. 11A. Specifically, as illustrated in FIG. 11A, the first light-emitting devices 23, the second light-emitting devices 24, and the third light-emitting devices 25 are disposed from the first row and the first column (the top left end) in a row direction in the order from the third light-emitting device 25, the second light-emitting device 24 to the first light-emitting device 23. This arrangement makes it possible to modify the outputs of the light emitting devices 2A in the row direction in the predetermined order. In addition, these light-emitting devices are disposed from the first row and the first column (the top left end) in a column direction in the order from the third light-emitting device 25, the first light-emitting device 23 to the second light-emitting device 24. This configuration makes it possible to modify the outputs of the light-emitting devices 2A in the column direction in the predetermined order.

In view of the above, when the light-emitting apparatus according to this embodiment includes a light-emitting device 2A with a different $V_f$ among the light-emitting devices 2A, a row containing the light-emitting device 2A with a different $V_f$ may have an increased or decreased current flow. Even in that case, the light outputs of the light-emitting devices 2A arranged in the row and column directions do not become uniformly high or low because three types of the light-emitting devices 2A having different outputs are disposed in the predetermined order not only in the row direction in which the light-emitting devices 2A are connected in series but also in the column direction. This configuration can also disperse the light outputs in the row and column directions. Furthermore, even if the light-emitting devices 2A include a light-emitting device 2A with a different $V_f$, bright and/or dark spots are hardly concentrated in a particular row or column, which can reduce unevenness in brightness as a whole.

Figure 11B:
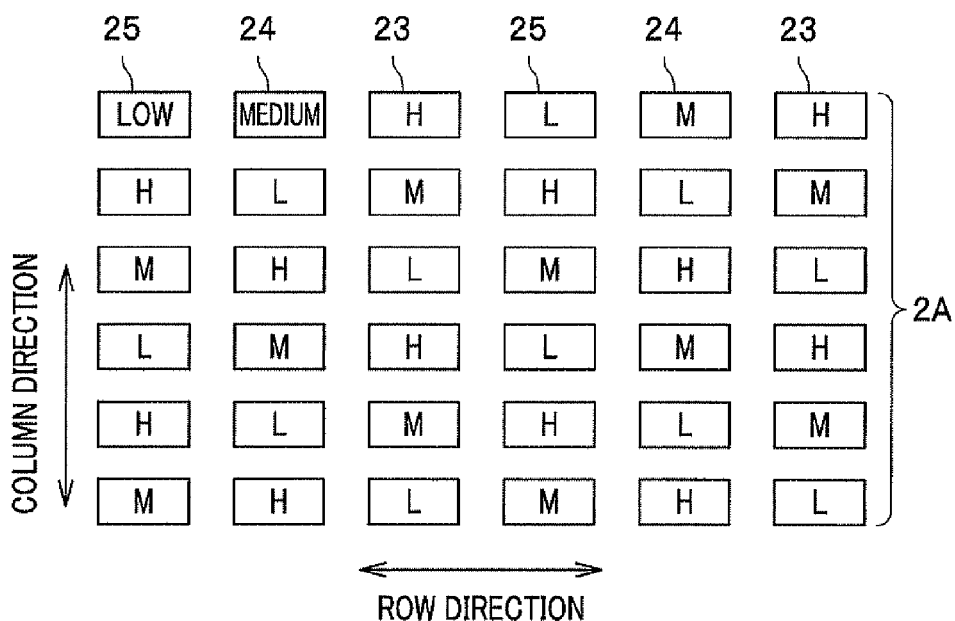
FIG. 11B is a layout in the case of having 6 rows×6 columns.

In addition, in the light-emitting apparatus according to this embodiment, the number of the light-emitting devices 2A in a row direction is preferably the same as the number of the light-emitting devices 2A in a column direction as illustrated in FIG. 11B. In addition, it is preferable that the numbers of the first light-emitting devices 23, the second light-emitting devices 24, and the third light-emitting devices 25 which are arranged in each row direction in the predetermined order are the same.

When the light-emitting apparatus according to this embodiment includes a light-emitting device 2A with a different $V_f$ among light-emitting devices 2A, a row containing the light-emitting device 2A with a different $V_f$ may have an increased or decreased current flow. Even in that case, such a configuration makes it possible to uniformly disperse the light outputs in the row and column directions because the numbers of three types of the light-emitting devices 2A with different outputs are the same in the row and column directions and the devices are evenly arranged. This can also reduce unevenness in brightness of the light-emitting apparatus as a whole.

Note that the light-emitting device arrangement step in the process of manufacturing the light-emitting apparatus according to the fourth embodiment includes: the first step of arranging the first light-emitting devices 23 in an every third column direction; the second step of arranging the second light-emitting devices 24 in an every third column direction which is adjacent to that of the first light-emitting devices 23 arranged in the first step; and the third step of arranging the third light-emitting devices 25 in an every third column direction which is adjacent to that of the second light-emitting devices 24 arranged in the second step;. By doing so, the first light-emitting devices 23, the second light-emitting devices 24, the third light-emitting devices 25 are arranged on the substrate 1.

[Fifth Embodiment]

Figure 12:
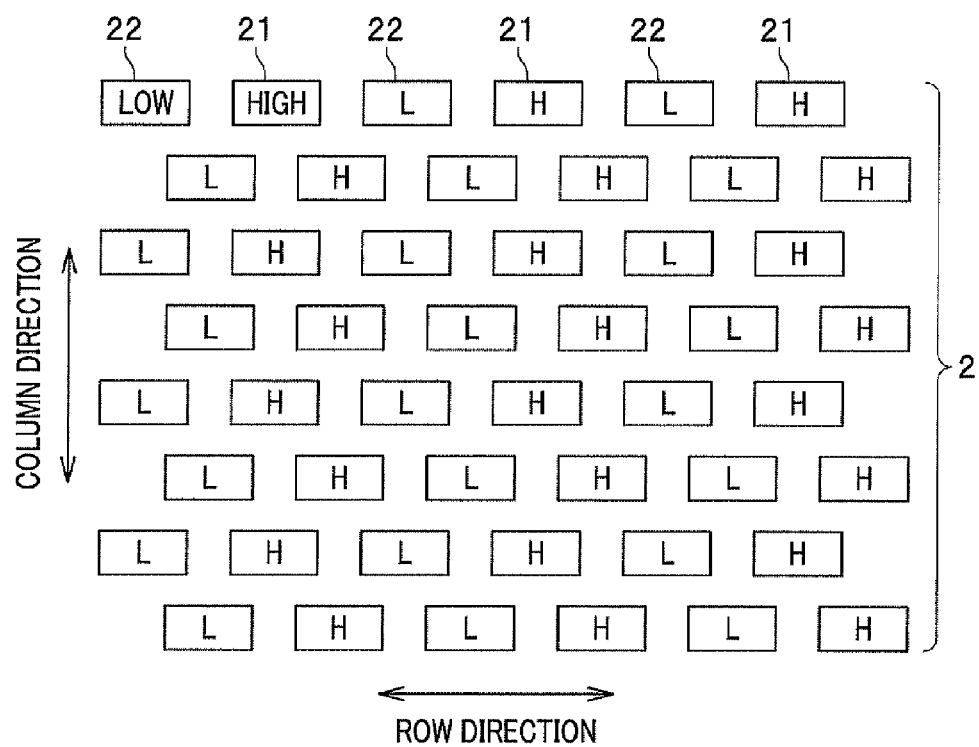
FIG. 12 schematically illustrates how to arrange light-emitting devices in a light-emitting apparatus according to the fifth embodiment of the present invention.

The following details a light-emitting apparatus according to the fifth embodiment by referring to FIG. 12. The light-emitting apparatus according to the fifth embodiment includes substantially the same configuration as in the light-emitting apparatus 100 according to the above-described first embodiment except for the arrangement of the light-emitting devices 2 (the first light-emitting devices 21 and the second light-emitting devices 22) as illustrated in FIG. 12. Hence, the description of the configuration which overlaps with that of the above light-emitting apparatus 100 is omitted.

In the light-emitting apparatus according to the fifth embodiment, the first light-emitting device 21 and the second light-emitting device 22 are alternately disposed in a row direction as well as the first light-emitting devices 21 and the second light-emitting devices 22 are disposed like a hound's-tooth in a column direction as illustrated in FIG. 12. That is, the first light-emitting devices 21 and the second light-emitting devices 22 are shifted in an alternate column as illustrated in FIG. 12.

In view of the above, when the light-emitting apparatus according to the fifth embodiment includes a light-emitting device 2 with a different $V_f$ among the light-emitting devices 2, a row containing the light-emitting device 2 with a different $V_f$ may have an increased or decreased current flow. Even in that case, the light outputs in the row and column directions do not become uniformly high or low because the light-emitting devices 2 with different outputs are not only alternately disposed in the row direction in which the light-emitting devices 2 are connected in series but also alternately shifted in the column direction. This configuration can also disperse the light outputs in the row and column directions. Furthermore, even if the light-emitting devices 2 include a light-emitting device with a different $V_f$, bright and/or dark spots are hardly concentrated in a particular row or column, which can reduce unevenness in brightness as a whole.

Hereinabove, light-emitting apparatuses and a method for manufacturing the light-emitting apparatus according to the present invention are specifically described by using embodiments. The scope of the present invention, however, is not limited to the above description, and should be broadly interpreted based on the recitation of the appended Claims. In addition, it is obvious that various alterations and modifications, etc., based on the above description are within the scope of the present invention.

For example, in FIGS. 5 and 9, the first light-emitting devices 21 and the second light-emitting devices 22 are alternately disposed from the first row and the first column (the top left end) in a row direction in the order from the second light-emitting device 22 having a low output to the first light-emitting device 21 having a high output. However, it is acceptable that these devices are alternately disposed from the first row and the first column (the top left end) in a row direction in the order from the first light-emitting device 21 having a high output to the second light-emitting device 22 having a low output.

In addition, in FIGS. 10 and 11, the first light-emitting devices 23, the second light-emitting devices 24, and the third light-emitting devices 25 are disposed from the first row and the first column (the top left end) in a row direction in the order from the third light-emitting device 25 having a low output, the second light-emitting device 24 having a medium output to the first light-emitting device 23 having a high output. However, it is acceptable that these devices are disposed from the first row and the first column (the top left end) in a row direction in the order from the first light-emitting device 23 having a high output, the second light-emitting device 24 having a medium output to the third light-emitting device 25 having a low output.

In addition, in the light-emitting apparatuses according to the first to the fifth embodiments, the mounting region 1 has a rectangular shape as illustrated in FIG. 2. In accordance with the shape of the mounting region 1, the light-emitting devices 2 are arranged in a rectangular pattern. However, the mounting region, for example, may have a circular shape and the light-emitting devices 2 may be arranged in circular patterns in accordance with the shape of the mounting region.

In such an embodiment, the light-emitting devices 2 are arranged on, for example, a circular mounting region (not shown) in a circular pattern with an equal interval in a vertical and a horizontal direction. The numbers of rows and columns may be the same or different. In addition, the wiring sections 3b and 4b of the anode 3 and the cathode 4 are formed along the periphery of the circular mounting region, and a first end of each wiring section may be adjacent to each other. Further, the number of the serially connected light-emitting devices 2 is the same. Each light-emitting device 2 which becomes an end of the serially connected devices is disposed in a column direction. The end is electrically connected to the wiring section 3b of the anode 3 or the wiring section 4b of the cathode 4. Then, the light-emitting devices 2 are connected in parallel. Moreover, the light-reflecting resin 6 is formed in a circular shape surrounding the mounting region 1a having the light-emitting section 20, and covers a portion of the wiring sections 3b and 4b, the protection device 5, and the wires W connecting therebetween.

In such a configuration, two types of light-emitting device 2 having different outputs are connected in series and in parallel. The light-emitting apparatus using this configuration can reduce unevenness in brightness. In addition, even if the $V_f$ values of the light-emitting devices 2 vary as described above, a difference in a brightness distribution among the light-emitting apparatuses can be reduced. Consequently, the difference can be reduced without exclusively using the light-emitting devices 2 with a specific $V_f$ in the light-emitting apparatus.

Note that when the mounting region according to an embodiment is circular, the first light-emitting devices 21 and the second light-emitting devices 22 are preferably alternately disposed in a row direction in substantially the same manner as in the light-emitting apparatuses according to the above first to fifth embodiments. In addition, the first light-emitting devices 21 and the second light-emitting devices 22 are preferably continuously or alternately arranged in a column direction. Moreover, it is preferable that in substantially the same manner as in the light-emitting apparatuses according to the above first to fifth embodiments, the numbers of the first light-emitting devices 21 and the second light-emitting devices 22 which are alternately disposed in each row direction are the same.

DESCRIPTION OF SYMBOLS 1, 1': Substrate
1a: Mounting region
2, 2A, 2': Light-emitting device
2a: p-electrode
2b: n-electrode
3: Anode
3a: Pad section
3b: Wiring section
4: Cathode
4a: Pad section
4b: Wiring section
5: Protection device
6: Light-reflecting resin
7: Sealing member
8: Relay wiring section
20: Light-emitting section
21, 23: First light-emitting device
22, 24: Second light-emitting device
25: Third light-emitting device
100: Light-emitting apparatus
CM: Cathode mark
W: Wire

The invention claimed is:

1. A light-emitting apparatus, comprising:
a plurality of light-emitting devices emitting light having the same hue,
a substrate on which the plurality of light-emitting devices are arranged;
an anode and a cathode to apply a voltage on the plurality of light-emitting devices, the anode and the cathode being formed on the substrate;
a relay wiring section formed on the substrate; and
a light-reflecting resin surrounding the plurality of light-emitting devices and covering the relay wiring section, a part of the anode and a part of the cathode,
wherein the light-emitting devices are arranged in a plurality of row and column directions;
the light-emitting devices arranged in the row direction are serially connected in the row direction to thereby form a plurality of rows of serially connected light-emitting devices; and
each row having the serially connected light-emitting devices is connected in parallel,
the light-emitting devices comprises
a first and a second light-emitting devices,
wherein the second light-emitting device has a lower output than that of the first light-emitting device; and
the first and the second light-emitting devices are alternately disposed in each row direction,
wherein the plurality of rows of serially connected light-emitting devices include first rows and second rows, the first rows being connected in parallel between the anode and the relay wiring section, the second rows being connected in parallel between the relay wiring section and the cathode.

2. The light-emitting apparatus according to claim 1, wherein at least one row does not have the same average of forward voltages of the light-emitting devices as that of another row.

3. The light-emitting apparatus according to claim 1, wherein the first and the second light-emitting devices are continuously disposed in the column direction.

4. The light-emitting apparatus according to claim 1, wherein the first and the second light-emitting devices are alternately disposed in the column direction.

5. The light-emitting apparatus according to claim 1, wherein the numbers of the first and the second light-emitting devices which are alternately disposed in each row direction are the same.

6. The light-emitting apparatus according to claim 1, wherein a direction of light-emitting devices in the first rows is opposite to a direction of light-emitting devices in the second rows.

7. A light-emitting apparatus, comprising:
a plurality of light-emitting devices emitting light having the same hue,
a substrate on which the plurality of light-emitting devices are arranged;
an anode and a cathode to apply a voltage on the plurality of light-emitting devices, the anode and the cathode being formed on the substrate;
a relay wiring section formed on the substrate; and
a light-reflecting resin surrounding the plurality of light-emitting devices and covering the relay wiring section, a part of the anode and a part of the cathode,
wherein the light-emitting devices are arranged in a plurality of row and column directions;
the light-emitting devices arranged in the row direction are serially connected in the row direction to thereby form a plurality of rows of serially connected light-emitting devices; and
each row having the serially connected light-emitting devices is connected in parallel,
the light-emitting devices comprises
a first, a second, and a third light-emitting device;
wherein the second light-emitting device has a lower output than that of the first light-emitting device;
the third light-emitting device has a lower output than that of the second light-emitting device; and
the first, the second, and the third light-emitting devices are disposed in each row direction in a predetermined order,
wherein the plurality of rows of serially connected light-emitting devices include first rows and second rows, the first rows being connected in parallel between the anode and the relay wiring section, the second rows being connected in parallel between the relay wiring section and the cathode.

8. The light-emitting apparatus according to claim 7, wherein at least one row does not have the same average of forward voltages of the light-emitting devices as that of another row.

9. The light-emitting apparatus according to claim 7, wherein the first, the second, and the third light-emitting devices are continuously disposed in the column direction.

10. The light-emitting apparatus according to claim 7, wherein the first, the second, and the third light-emitting devices are disposed in the column direction in a predetermined order.

11. The light-emitting apparatus according to claim 7, wherein the numbers of the first, the second, and the third light-emitting devices which are disposed in each row direction in the predetermined order are the same.

12. The light-emitting apparatus according to claim 7, wherein a direction of light-emitting devices in the first rows is opposite to a direction of light-emitting devices in the second rows.

13. A light-emitting apparatus, comprising:
a plurality of light-emitting devices emitting light having the same hue, the light-emitting devices being arranged in a plurality of row and column directions;
a substrate having the light-emitting devices thereon;
an anode wiring section and a cathode wiring section electrically connected to the light-emitting devices, the sections being formed on the substrate;
an anode and a cathode between which a voltage is applied via the anode wiring section and the cathode wiring section;
a relay wiring section formed on the substrate; and
a light-reflecting resin surrounding the plurality of light-emitting devices and covering the relay wiring section, the anode wiring section and the cathode wiring section,
wherein the same number of the light-emitting devices are serially connected to thereby form a plurality of rows of serially connected light-emitting devices; and
each end of the serially connected light-emitting devices is arranged in a column direction and is electrically connected to either the anode wiring section or the cathode wiring section to be connected in parallel,
the light-emitting devices comprises a first and a second light-emitting devices,
wherein the second light-emitting device has a lower output than that of the first light-emitting device; and the first and the second light-emitting devices are alternatively disposed in each row direction, wherein the plurality of rows of serially connected light-emitting devices include first rows and second rows, the first rows being connected in parallel between the anode wiring section and the relay wiring section, the second rows being connected in parallel between the relay wiring section and the cathode wiring section.

14. The light-emitting apparatus according to claim 13, wherein the first and the second light-emitting devices are continuously disposed in the column direction.

15. The light-emitting apparatus according to claim 13, wherein the first and the second light-emitting devices are alternately disposed in the column direction.

16. The light-emitting apparatus according to claim 13, wherein the numbers of the first and the second light-emitting devices which are alternately disposed in each row direction are the same.

17. The light-emitting apparatus according to claim 13, wherein a direction of light-emitting devices in the first rows is opposite to a direction of light-emitting devices in the second rows.

18. A method for manufacturing a light-emitting apparatus, comprising:

a plurality of light-emitting devices emitting light having the same hue, wherein the light-emitting devices are arranged in a plurality of row and column directions;

the light-emitting devices arranged in the row direction are serially connected in the row direction; and each row having the serially connected light-emitting devices is connected in parallel, the method comprising:

a light-emitting device classification step of classifying the plurality of light-emitting devices emitting light having the same hue into a first and a second groups, the second group having a lower output than that of the first group; and a light-emitting device arrangement step comprising:

arranging first light-emitting devices selected from the first group and second light-emitting devices selected from the second group in the row and column directions on a substrate having a relay wiring section, an anode and a cathode so that the first and the second light-emitting devices are alternately disposed in the row and column directions;

serially connecting the light-emitting devices disposed in each row direction to thereby form a plurality of rows of serially connects light-emitting devices;

connecting each row in parallel;

electrically connecting the light-emitting devices to the anode, the cathode and the relay wiring section; and covering the relay wiring section, a part of the anode and a part of the cathode by a light-reflecting resin surrounding the light-emitting devices, wherein the plurality of rows of serially connected light-emitting devices include first rows and second rows, the first rows being connected in parallel between the anode and the relay wiring section, the second rows being connected in parallel between the relay wiring section and the cathode.

19. The method according to claim 18, wherein the light-emitting device arrangement step further comprises:

a first step of arranging the first light-emitting devices in a column direction; and a second step of arranging the second light emitting devices in a column direction adjacent to the first light-emitting devices arranged in the first step.

20. The method according to claim 18, wherein a direction of light-emitting devices in the first rows is opposite to a direction of light-emitting devices in the second rows.

* * * * *